United States Patent
Los et al.

(10) Patent No.: US 11,367,805 B2
(45) Date of Patent: Jun. 21, 2022

(54) SOLAR CELLS AND METHODS OF MAKING THE SAME

(71) Applicant: First Solar, Inc., Tempe, AZ (US)

(72) Inventors: Andrei Los, Perrysburg, OH (US); Roger Malik, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 16/316,897

(22) PCT Filed: Jul. 12, 2017

(86) PCT No.: PCT/US2017/041650
§ 371 (c)(1),
(2) Date: Jan. 10, 2019

(87) PCT Pub. No.: WO2018/013641
PCT Pub. Date: Jan. 18, 2018

(65) Prior Publication Data
US 2019/0363214 A1  Nov. 28, 2019

Related U.S. Application Data

(60) Provisional application No. 62/362,111, filed on Jul. 14, 2016.

(51) Int. Cl.
*H01L 31/101* (2006.01)
*H01L 31/112* (2006.01)
*H01L 31/02* (2006.01)
*H01L 31/0232* (2014.01)

(52) U.S. Cl.
CPC .... *H01L 31/1127* (2013.01); *H01L 31/02021* (2013.01); *H01L 31/0232* (2013.01)

(58) Field of Classification Search
CPC .......... H01L 31/02021; H01L 31/0232; H01L 31/1127; H01L 31/02966; H01L 31/073; H01L 31/1832; Y02E 10/543
See application file for complete search history.

(56) References Cited

U.S. PATENT DOCUMENTS

| | | | |
|---|---|---|---|
| 5,294,808 A | 3/1994 | Lo | |
| 7,939,363 B1* | 5/2011 | Johnson | ............ H01L 21/02439 438/87 |
| 9,231,134 B2 | 1/2016 | Foust et al. | |

(Continued)

FOREIGN PATENT DOCUMENTS

| | | |
|---|---|---|
| CN | 104638038 A | 5/2015 |
| WO | 2009045293 A2 | 4/2009 |
| WO | 2010009436 A2 | 1/2010 |

OTHER PUBLICATIONS

Liu et al., "Carrier lifetimes and interface recombination velocities in CdTe/MgxCd1-xTe double heterostructures with different Mg compositions grown by molecular beam epitaxy," Applied Physics Letters 107 (2015) 041120.*

(Continued)

*Primary Examiner* — Jay C Kim
(74) *Attorney, Agent, or Firm* — MacMillan, Sobanski & Todd, LLC

(57) ABSTRACT

Solar cells, absorber structures, back contact structures, and methods of making the same are described. The solar cells and absorber structures include a pseudomorphically strained electron reflector layer.

20 Claims, 11 Drawing Sheets

(56) References Cited

U.S. PATENT DOCUMENTS

| | | | |
|---|---|---|---|
| 9,269,849 B2* | 2/2016 | Yu | H01L 31/073 |
| 9,431,569 B2 | 8/2016 | Barabash et al. | |
| 9,437,760 B2* | 9/2016 | Damjanovic | H01L 31/0296 |
| 9,450,115 B2 | 9/2016 | Christensen et al. | |
| 9,702,988 B1* | 7/2017 | Rhiger | G01T 3/08 |
| 9,853,177 B2 | 12/2017 | Yu et al. | |
| 9,871,154 B2 | 1/2018 | Duggal et al. | |
| 10,026,861 B2 | 7/2018 | Sankin et al. | |
| 10,396,232 B2* | 8/2019 | Zhang | H01L 31/073 |
| 10,622,409 B2* | 4/2020 | Kamino | H01L 51/0032 |
| 2011/0005594 A1* | 1/2011 | Powell | H01L 31/0392 136/258 |
| 2011/0061737 A1 | 3/2011 | Hotz et al. | |
| 2013/0104985 A1 | 5/2013 | Korevaar et al. | |
| 2014/0166107 A1 | 6/2014 | Lee et al. | |
| 2014/0261667 A1 | 9/2014 | Buller et al. | |
| 2015/0000733 A1* | 1/2015 | Buller | H01L 31/0749 136/256 |
| 2015/0207011 A1* | 7/2015 | Garnett | H01L 31/0725 136/255 |
| 2016/0190368 A1 | 6/2016 | Cao et al. | |
| 2017/0352772 A1 | 12/2017 | Eaglesham et al. | |
| 2019/0296174 A1 | 9/2019 | Gloeckler et al. | |
| 2020/0066928 A1 | 2/2020 | Buller et al. | |

OTHER PUBLICATIONS

DiNezza et al., "Growth, steady-state, and time-resolved photoluminescence study of CdTe/MgCdTe double heterostructures on InSb substrates using molecular beam epitaxy," Applied Physics Letters 103 (2013) 193901.*

Seyedmohammadi et al., "Molecular beam epitaxial re-growth of CdTe, CdTe/CdMgTe and CdTe/CdZnTe double heterostructures on CdTe/InSb(100) substrates with As cap," Journal of Crystal Growth 425 (2015) pp. 181-185.*

Bakr, "Characterization of a CdZnTe/CdTe heterostructure system prepared by Zn diffusion into a CdTe thin film," Journal of Crystal Growth 235 (2002) pp. 217-223.*

Kim et al., "Astudy on photoluminescence of interface layer of ZnTe/CdTe heterostructure," Journal of Crystal Growth 214/215 (2000) pp. 225-228.*

Cohen et al., "MOCVD growth of ordered Cd(1-x)ZnxTe epilayers," Journal of Crystal Growth 198/199 (1999) pp. 1174-1178.*

Levy et al., "Characterization of CdTe substrates and MOCVD Cd1—xZnxTe epilayers," Journal of Crystal Growth 197 (1999) pp. 626-629.*

Rodriguez et al., "Influence of crystalline quality on the thermal, optical and structural properties of Cd1—xZnxTe for low zinc concentration," Journal of Crystal Growth 233 (2001) pp. 275-281.*

Bolotnikov et al., "Characterization and evaluation of extended defects in CZT crystals for gamma-ray detectors," Journal of Crystal Growth 379 (2013) pp. 46-56.*

Ben-Dor et al., "Equilibrium composition in II—VI telluride MOCVD systems," Journal of Crystal Growth 198/199 (1999) pp. 1151-1156.* de Melo et al., "Graded composition CdxZn1—xTe films grown by Isothermal Close Space Sublimation technique," Solar Energy Materials & Solar Cells 138 (2015) pp. 17-21.*

Yoo et al., "Band-gap engineering of Cd1—xZnxTe films deposited by pulsed laser deposition." Thin Solid Films 612 (2016) pp. 91-95.*

Liu et al., "Minority carrier lifetime of lattice-matched CdZnTe alloy grown on InSb substrates using molecular beam epitaxy," Journal of Vacuum Science & Technology B 33 (2015) 011207.*

LeBlanc et al., "Determining and Controlling the Magnesium Composition in CdTe/CdMgTe Heterostructures," Journal of Electronic Materials (2017).*

Karpierz, "Far-Infrared Magnetospectroscopy of Shallow Donors in Quantum Dots in CdTe/CdMgTe-Based Quantum Wells," Journal of the Korean Physical Society 53 (2008) pp. 2967-2971.*

Xiao et al., "Modeling of CdZnTe and Cigs and Tandem Solar Cells," IEEE (2010).*

Ferdaous, "Numerical Analysis of Ultra Thin High Efficiency Cd1—xZnxS/Cd1—xZnxTe Solar Cell," Electrical and Electronic Engineering 5 (2015) pp. 14-18.*

Dhere et al., "Investigation of CdZnTe for Thin-Film Tandem Solar Cell Applications," Preprint (2003).*

Rezaie et al., "Efficiency improvement of CdZnTe solar cell by modification of interface layer," Optical Quantum Electronics 47 (2015) pp. 3237-3251.*

Boulou et al., "Cathodoluminescence measurements of the minoritycarrier lifetime in semiconductors", Journal of Applied Physics, 1997, vol. 48, No. 11, pp. 4712-4721.

Hinckley et al., "Dependence of pseudomorphic semiconductor band gap on substrate orientation", Journal of Applied Physics, 1991, vol. 69, No. 4, pp. 2694-2696.

Nasrallah et al., "Calculation of band offsets in $Cd_{1-x}X_xTe$ alloys, X = Zn, Mg, Hg and Mn and magnetic effects in CdMnTe", Journal of Alloys and Compounds, 2001, pp. 7677-7683.

Sites et al., "Strategies to increse CdTe solar-cell voltage", Thin Solid Films 515, 2007, pp. 6099-6102.

Indian First Examination Report, dated Apr. 12, 2021, Application No. 201917005664.

PCT Search Report and Written Opinion, dated Sep. 19, 2017, Application No. PCT/US2017/041650.

Chinese First Office Action, dated Dec. 2, 2021, Application No. 201780056548.X.

* cited by examiner

Critical Thickness in CdMTe Alloys

| M mole fraction | d-CdZnTe (Ang) | d-CdMnTe (Ang) | d-CdMgTe (Ang) |
|---|---|---|---|
| 0.00 | infinite | infinite | infinite |
| 0.05 | 3086.6 | 13265.0 | 15128.8 |
| 0.10 | 1091.3 | 4689.9 | 5348.8 |
| 0.15 | 594.0 | 2552.9 | 2911.5 |
| 0.20 | 385.8 | 1658.1 | 1891.1 |
| 0.25 | 276.1 | 1186.5 | 1353.2 |
| 0.30 | 210.0 | 902.6 | 1029.4 |
| 0.35 | 166.7 | 716.2 | 816.9 |
| 0.40 | 136.4 | 586.2 | 668.6 |
| 0.45 | 114.3 | 491.3 | 560.3 |
| 0.50 | 97.6 | 419.5 | 478.4 |
| 0.55 | 84.6 | 363.6 | 414.7 |
| 0.60 | 74.3 | 319.1 | 363.9 |
| 0.65 | 65.9 | 283.0 | 322.8 |
| 0.70 | 58.9 | 253.2 | 288.8 |
| 0.75 | 53.1 | 228.3 | 260.4 |
| 0.80 | 48.2 | 207.3 | 236.4 |
| 0.85 | 44.0 | 189.2 | 215.8 |
| 0.90 | 40.4 | 173.7 | 198.1 |
| 0.95 | 37.3 | 160.2 | 182.7 |
| 1.00 | 34.5 | 148.3 | 169.1 |

FIG. 4

| CdTe (um) | T2 (ns) |
|---|---|
| 1 | 0.69 |
| 2 | 1.06 |
| 5 | 2.37 |
| 10 | 2.97 |

SOLAR CELLS AND METHODS OF MAKING THE SAME

This is a national phase application of international application PCT/US17/41650, filed on Jul. 12, 2017, published as WO 2018/013641; which claims the benefit of U.S. Provisional Application No. 62/362,111, filed on Jul. 14, 2016, and is incorporated by reference herein.

BACKGROUND OF THE INVENTION

A solar cell typically includes a light absorbing material layer, referred to as an absorber, connected to an external circuit. Charge carriers are generated in the absorber layer by the absorption of photons of light therein, which are subsequently driven towards one or more contacts within the cell. The charge establishes a voltage at open circuit ($V_{oc}$), and generates a current at short circuit ($J_{sc}$). As such, when a load is connected to an external circuit, the solar cell can produce current and voltage to do electrical work.

A typical single-junction solar cell is composed of a substrate on which to form the device, two ohmic contacts to conduct current to an external electrical circuit, and two or more semiconductor layers in series to form the semiconductor junction. At least one of these semiconductor layers (the absorber) is chosen such that its bandgap is of a value for near-optimum conversion of solar radiation. In the typical design, one semiconductor layer is doped n-type (meaning the semiconductor has an excess of negatively charged electrons), and the adjacent layer is doped p-type (meaning the semiconductor has an excess of positively charged holes). The intimate proximity of these layers forms a semiconductor p-n junction. The p-n junction provides an electric field that facilitates charge separation in the absorber layer(s) when the cell is illuminated, and charge collection at the ohmic contacts.

When sunlight or other optical radiation with energy greater than the semiconductor bandgap is absorbed in the semiconductor layers, photons are converted to electron-hole pairs. Electrons and holes are separated by the electric field created by the formation of the p-n junction. The separation of carriers establishes a potential difference across the junction and enables the junction to force current through an external electrical circuit. In this way, optical power is converted into electrical power.

Electrons in the p-type semiconductors and holes in the n-type semiconductors are referred to as "minority carriers." Photogenerated minority carriers move within the semiconductor layer in which they were created as driven by diffusion and drift until they either recombine with carriers of the opposite type within the semiconductor in which they were created, recombine at an interface of the semiconductor in which they were created, or are collected by the other semiconductor layer. Recombination is a loss mechanism which reduces the photovoltaic power conversion efficiency in photovoltaic devices.

Thin film CdTe solar cells normally employ a relatively thick CdTe p-doped solar absorber region (2-5 µm) to prevent recombination of photo-generated electrons with holes in the vicinity of the back contact region. This results in increased recombination in the absorber bulk, increased materials costs and decreased manufacturing throughput, negatively impacting production costs. An electron reflector layer can prevent electrons from reaching the back contact interface without increasing absorber layer thickness above optimal. In Si-based solar cells, electron reflectors can be utilized by using a step change in doping p/p+ near the back p-type ohmic contact to increase band bending in the conduction/valence bands at the doping transition. However, this approach is not feasible in polycrystalline CdTe solar cells, since it is very difficult to dope p-type greater than $1 \times 10^{15}$ cm$^{-3}$. Thus, alternatives are needed in order to prevent recombination of photo-generated electrons with holes in the vicinity of the back contact region in polycrystalline CdTe solar cells.

BRIEF DESCRIPTION OF THE DRAWING

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4 provides the critical thickness data shown in FIG. 3 in tabular form according to one or more embodiments shown and described herein;

DETAILED DESCRIPTION

Figure 1:
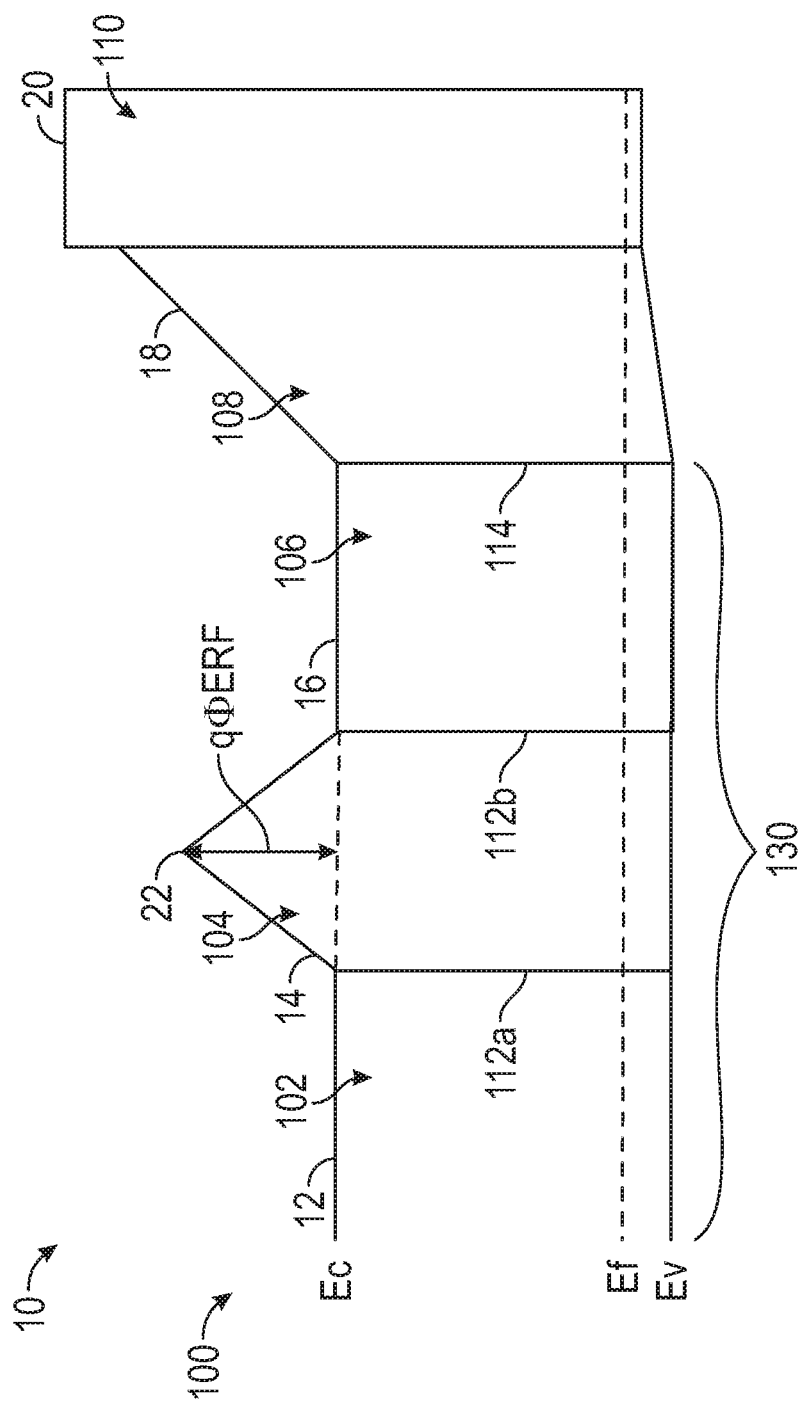
FIG. 1 schematically depicts a band diagram of a back structure for a solar cell according to one or more embodiments shown and described herein.

All ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, a state range of "1 to 10" should be considered to include any and all subranges beginning with a minimum value of 1 or more and ending with a maximum value of 10 or less, such as 1 to 3.3, 4.7 to 7.4, 5.5 to 10, and the like.

In the present disclosure, when a layer is described as being disposed or positioned "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," "back," "rear," "front," and variations of these terms is made for convenience, and does not require any particular orientation of the components unless otherwise stated. Likewise, a layer that is "disposed on" or "on" a different layer does not necessarily imply that the two layers are in direct contact with one another and may allow for the presence of intervening layers. In contrast, the term "adjacent" is used to imply that two layers are in direct physical contact. Furthermore, the terms "on top of," "formed over," "deposited over," and "provided over" mean formed, deposited, provided, or located on a surface but not necessarily in direct contact with the surface. For example, a layer "formed over" a substrate does not preclude the presence of one or more other layers or films of the same or different composition located between the formed layer and the substrate. The term "transparent" as used herein refers to material that allows an average transmission of at least 70% of incident electromagnetic radiation having a wavelength in a range of from about 300 nm to about 900 nm.

The term "electron reflector" refers to a film, layer, or material that creates an energy barrier or other obstacle to the movement of electrons.

The term "graded" as used herein refers to a change in the concentration of an element or substance across the thickness of a layer or material. Grading can be gradual or abrupt, and can include either increases in concentration or decreases in concentration.

The term "single crystal" refers to a homogeneous solid formed by a repeating three-dimensional pattern of atoms, ions, or molecules. A "grain boundary" is a topological surface where two or more single crystals meet and are at least partially contacting. The respective lattices of adjacent single crystals may or may not match at a grain boundary.

The term "epitaxial" refers to an extended film, such as a single crystal film, grown on top of a substrate, such as a single crystal substrate, in which the crystallographic structure of the film mimics the crystal structure of the underlying substrate. An epitaxial film tends to grow at the same lattice conditions of the underlying substrate.

The term "interface" refers to the region near a free surface or grain boundary, as well as to the region between two different materials. Electrical properties of an interface can be affected by many things, such as trapped charge, dipole layers, and interdiffusion. Properties of a material at an interface can also be affected by localized energy levels, i.e., energy levels that span a limited energy range (as opposed to energy bands). Localized energy levels are typically a result of having impurities, intrinsic defects, or crystallographic defects at an interface.

The term "lattice mismatch" refers to a situation where materials having different lattice constants are brought together by, for instance, deposition of one material directly adjacent to the other, such as hetero-epitaxy. Lattice mismatch generally prevents growth of defect-free epitaxial film unless the thickness of the film is below a certain critical thickness. The term "misfit dislocation" refers to a defect formed from lattice distortion caused by a difference in the lattice constants between two adjacent materials. If the thickness of the film is below the critical thickness, the lattice mismatch is compensated by the strain in the film, also known as "pseudomorphic strain." Misfit dislocations do not form if the film thickness is below the critical thickness and such "pseudomorphic" layers are, therefore, of a much better crystallographic quality.

In pseudomorphically grown layers, the epitaxial layer is compressed (i.e., experiences compressive strain) in the plane of the substrate surface if the intrinsic lattice parameter of the substrate is smaller than that of the epitaxial layer. Conversely, the epitaxial layer is stretched, or put under tensile strain, when the intrinsic lattice parameter of the epitaxial layer is smaller than that of the substrate. However, as the thickness of the epitaxial layer is increased, the strain energy in the epitaxial layer grows and, typically, the layer finds some way to reduce the strain energy. This may occur by plastic flow through the motion of dislocations, through the creation of surface morphological features which allow strain relaxation, or, particularly when the strain is tensile, through cracking of the film.

As described herein, pseudomorphically strained electron reflectors are useful in solar cells, such as CdTe solar cells. In accordance with the present disclosure, the use of a thin, pseudomorphically strained ERF between two p-doped regions (such as the solar absorber and back p– or p+-contact layer) enables the use of thinner absorber layers (such as a 1 µm absorber layer), and can improve both the open-circuit voltage and the fill factor in the solar cells. Thus, provided herein are absorber structures having an ERF between two p-type layers, and solar cells made with such absorber structures. In some embodiments, the solar cells further include an interfacial back contact layer.

FIG. 1 shows a band energy diagram 10 for a non-limiting example of a back structure 100 for solar cells from a first p-type semiconductor layer 102 to the back contact 110. The back structure 100 includes a first p-type semiconductor layer 102 (e.g., and absorber layer), a pseudomorphically strained electron reflector layer 104, a second p-type semiconductor layer 106, an interfacial layer 108 (e.g., a p+ interfacial layer), and a back contact layer 110 (e.g., a p+ ohmic back contact layer). Together, the first p-type semiconductor layer 102, the pseudomorphically strained electron reflector layer 104, and the second p-type semiconductor layer 106 make up the absorber structure 130.

Figure 2:
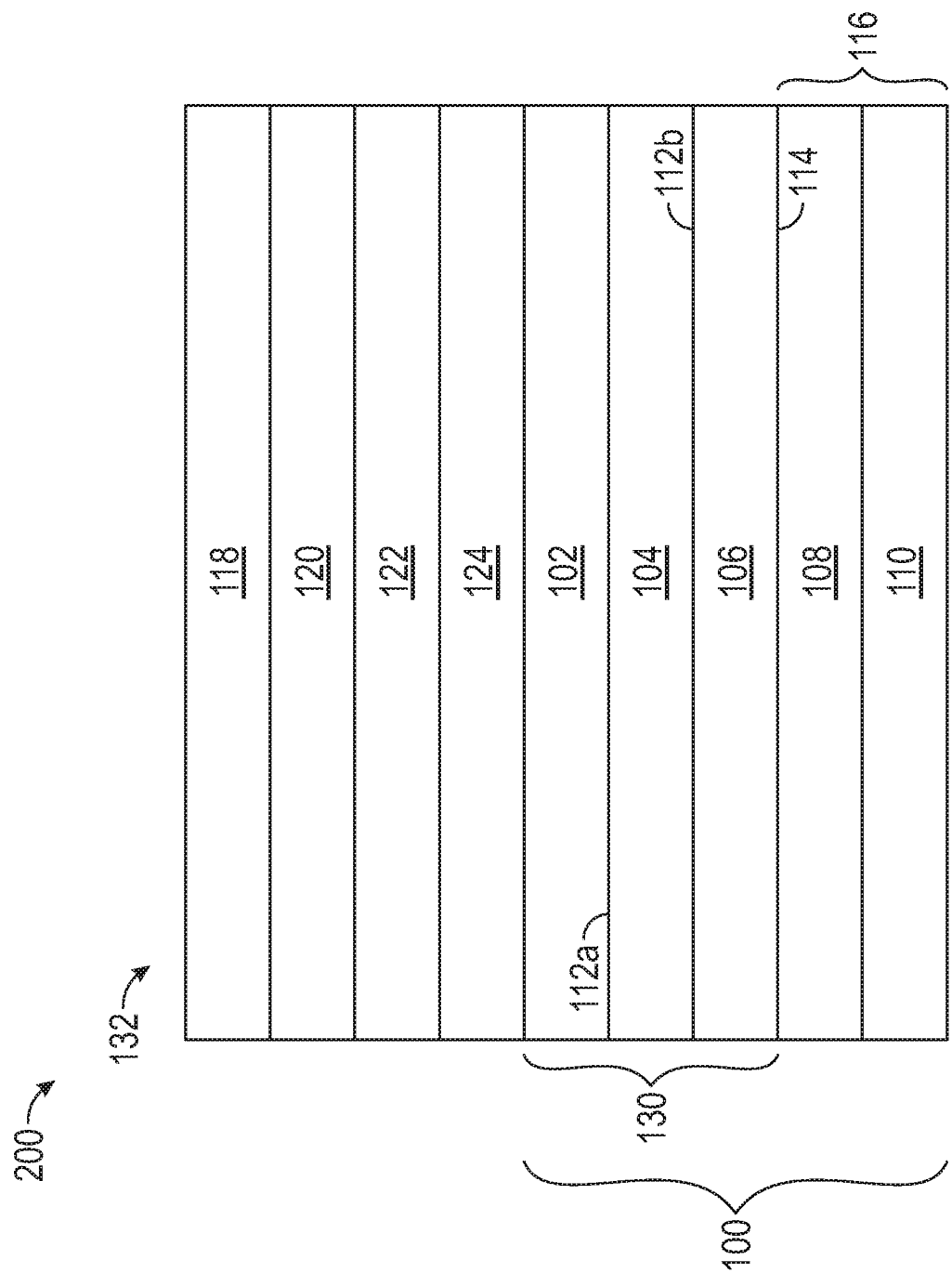
FIG. 2 schematically depicts a thin film solar cell having a window layer and an interfacial layer according to one or more embodiments shown and described herein.

Referring collectively to FIGS. 1 and 2, an effective double heterostructure is depicted. FIG. 1 shows a band energy diagram 10 for a back structure 100. FIG. 2 shows a schematic of a solar cell 200 having the back structure 100 corresponding to the band energy diagram 10 depicted in FIG. 1. The effective double heterostructure includes the pseudomorphically strained electron reflector layer 104 and the interfacial layer 108 that act to sandwich the second p-type semiconductor layer 106 between two relatively higher bandgap materials. More specifically, the pseudomorphically strained electron reflector layer 104 has a conduction energy band 14 that is higher than that of each of the bounding p-type layers, i.e., the conduction energy band 14 is higher than the conduction energy band 12 of the first p-type semiconductor layer 102 and the conduction energy band 16 of the second p-type semiconductor layer 106. The interfacial layer 108 has a conduction energy band 18 that is higher than the conduction energy band 16 of the second p-type semiconductor layer 106. Conduction band energy 20 of the back contact 110 is higher than the conduction energy band 16 and the conduction energy band 18 in this example. However, the back contact layer 110 can have any value of conduction band energy as long as a good quality contact is provided. Furthermore, the present disclosure is not limited to double heterostructures.

The pseudomorphically strained electron reflector layer 104 is a thin layer grown between the first p-type semiconductor layer 102 and the second p-type semiconductor layer 106, which can be provided as two CdTe-p bounding layers, near the back contact 110, which is also p-type. In certain embodiments, the pseudomorphically strained electron reflector layer 104 has a thickness of from about 1 nm to about 100 nm. In some examples, the pseudomorphically strained electron reflector layer 104 has a thickness of from about 10 nm to about 75 nm. In one non-limiting example, the pseudomorphically strained electron reflector layer 104 has a thickness of about 25 nm. The first p-type semiconductor layer 102 and the pseudomorphically strained electron reflector layer 104 form a heteroepitaxial structure, which is a structure where a semiconductor is epitaxially grown on a substrate of a different lattice constant. Since the pseudomorphically strained electron reflector layer 104 is thinner than the so-called "critical thickness," the elastic energy in the system is not large enough to create misfit dislocations, and a pseudomorphic structure is produced. Misfit dislocations, if produced, would detrimentally affect device performance because there is a probability for electrons to travel to defect states at the dislocations and recombine. Thus, the pseudomorphically strained electron reflector layer 104 is generally thinner than the critical thickness so as to be a pseudomorphic layer that creates a substantially dislocation-free interface 112a with the first p-type semiconductor layer 102 and a substantially dislocation-free interface 112b with the second p-type semiconductor layer 106. Together, the sandwich of the first p-type semiconductor layer 102, the pseudomorphically strained electron reflector layer 104, and the second p-type semiconductor layer 106 form an absorber structure 130 useful as an improved absorber material in many different types of monocrystalline or polycrystalline solar cells. Furthermore, the presence of the second p-type semiconductor layer 106 protects the pseudomorphically strained electron reflector layer 104 during chlorine treatments.

In the back structure 100, the first p-type layer 102 (such as a CdTe-p layer) is at the back of the solar photon absorber region, and the second p-type semiconductor layer 106 (such as a thin CdTe-p layer) is between the pseudomorphically strained electron reflector electron reflector layer 104 and the back contact 110, which can be a p-type ohmic contact, of the solar cell 200. The pseudomorphically strained electron reflector layer 104 is composed of a material having a conduction band 14 higher than the conduction band 12 of the absorber material of the first p-type semiconductor layer 102 such as, for example, CdTe. The pseudomorphically strained electron reflector layer 104 acts as an energy barrier to electrons. In certain embodiments, the pseudomorphically strained electron reflector layer 104 is a graded CdMTe (M=Mg, Zn, or Mn) layer, meaning the concentration of M changes across the thickness of the pseudomorphically strained electron reflector layer 104. In particular, the concentration of M in the pseudomorphically strained electron reflector layer 104 is graded in a gradual or strain-tolerant grading profile that increases to a peak M concentration and then decreases. In such a grading profile, the concentration of M increases from insignificant near the substantially dislocation-free interface 112a to a peak M concentration at a position 22 that is intermediate between the substantially dislocation-free interface 112a and the substantially dislocation-free interface 112b, and then decreases so as to be insignificant near the substantially dislocation-free interface 112b. Preferably, the increase and decrease are both gradual.

In some embodiments, the pseudomorphically strained electron reflector layer 104 is graded with a triangular profile having the maximum M mole fraction in the center of the pseudomorphically strained electron reflector layer 104, at a point 22 that is substantially equidistant between the substantially dislocation-free interface 112a and the substantially dislocation-free interface 112b. In the triangular grading profile, the concentration of M gradually increases from zero at the substantially dislocation-free interface 112a to a peak M concentration at a position 22 that is approximately equidistant from the substantially dislocation-free interface 112a and the substantially dislocation-free interface 112b, and then gradually decreases to zero at the substantially dislocation-free interface 112b. However, the grading profile does not need to be triangular, so long as it is not abrupt at or near the substantially dislocation-free interface 112a and the substantially dislocation-free interface 112b between the pseudomorphically strained electron reflector layer 104 and the bounding p-type semiconductor layers, i.e., the first p-type semiconductor layer 102 and the second p-type semiconductor layer 106. In other words, the concentration of M near the substantially dislocation-free interfaces 112a, 112b is not significant. Furthermore, the peak M concentration does not need to be approximately equidistant from the substantially dislocation-free interface 112a and the substantially dislocation-free interface 112b. In some non-limiting examples, the grading profile is bell-shaped or rounded instead of triangular, though still not abrupt at the substantially dislocation-free interfaces 112a, 112b. In other embodiments, the increase can be an exponential increase, though not abrupt at the substantially dislocation-free interface 112a, and/or the decrease can be an exponential decrease, though not abrupt at the substantially dislocation-free interface 112b. By grading the concentration of M, the pseudomorphically strained electron reflector layer 104 can be grown thicker (e.g., from a plurality of stepwise-deposited layers having varying M concentrations) before dislocations would form. The grading does not form a significant hole barrier.

The concentration of M in the pseudomorphically strained electron reflector layer 104 is preferably graded so as to increase gradually and then decrease gradually. In other words, the concentration of M does not abruptly change at or near the substantially dislocation-free interface 112a or the substantially dislocation-free interface 112b. The highest concentration of M, at the peak of the conduction band 14, can range from about 0.10 mol % to about 100 mol %, or from about 5 mol % to about 80 mol %, or from about 25 mol % to about 60 mol %, depending on the thickness of the pseudomorphically strained electron reflector layer 104, the desired electron reflector barrier height qΦERF of the conduction energy band 14 of the pseudomorphically strained electron reflector layer 104, and the material of M. For example, when M is Mg, the peak concentration of M is from about 17 mol % to about 28 mol %. When M is Zn, the peak concentration of M is from about 31 mol % to about 51 mol %. When M is Mn, the peak concentration of M is from about 14 mol % to about 24 mol %. In particular embodiments, the pseudomorphically strained electron reflector layer 104 has a triangular graded concentration of M, with the highest M mole fraction in the center of the pseudomorphically strained electron reflector layer 104. The electron reflector layer 104 is bounded by the first p-type semiconductor layer 102 and the second p-type semiconductor layer 106. In certain embodiments, both the first p-type semiconductor layer 102 and the second p-type semiconductor layer 106 are formed from semiconductor material, such as p-type CdTe layers. Because the pseudomorphically strained electron reflector layer 104 is pseudomorphically strained, the substantially dislocation-free interfaces 112a, 112b between the electron reflector layer 104 and the bounding p-type CdTe layers (first p-type semiconductor layer 102 and second p-type semiconductor layer 106) are free, or substantially free, of misfit dislocations.

In some embodiments, the pseudomorphically strained electron reflector layer 104 is a Cd—Zn—Te (CdZnTe) layer. A non-limiting example of a suitable CdZnTe layer is a triangular graded $Cd_{1-x}Zn_xTe$ structure sandwiched between the first p-type semiconductor layer 104 and the second p-type semiconductor layer 106 (e.g., two CdTe regions). Without wishing to be bound by theory, it is believed that this structure leads to a barrier to electron transport due to the change in the electron electrochemical potential in the CdZnTe layer. In other embodiments, the pseudomorphically strained electron reflector layer 104 is a Cd—Mg—Te layer such as a triangular graded $Cd_{1-x}Mg_xTe$ layer. In other embodiments, the pseudomorphically strained electron reflector layer 104 is a Cd—Mn—Te layer such as, but not limited to, a triangular graded $Cd_{1-x}Mn_xTe$, layer. Regardless of the composition of the pseudomorphically strained electron reflector layer 104, the pseudomorphically strained electron reflector layer 104 does not need to be triangular graded. Furthermore, the pseudomorphically strained electron reflector layer 104 can be doped with any number of suitable dopants including, but not limited to: nitrogen, phosphorus, arsenic, antimony, bismuth, copper, silver, and gold.

As seen in FIG. 1, the center of the pseudomorphically strained electron reflector layer 104 has a peak in the conduction band 14 at a higher energy level than the two adjacent p-type layers—the first p-type semiconductor layer 102 and the second p-type semiconductor layer 106. This higher peak conduction band acts as a barrier to electrons. The skilled person will understand that the peak M concentration is based upon forming a sufficiently high electron reflector barrier height qΦERF to effectively suppress electron emission over the electron reflector barrier. An electron reflector barrier height qΦERF ranging from about 120 meV to about 200 meV in the conduction band 14 is sufficient to suppress electron injection by a factor of 99.9%. However, it is understood that for certain electron reflector materials, the electron reflector barrier height qΦERF can be greater than 200 meV. The corresponding M mole fractions in CdMTe alloys necessary to produce a conduction band barrier height qΦERF of at least about 120 meV are approximately: Zn=31%, Mg=17%, and Mn=14%. Thus, in non-limiting examples, the pseudomorphically strained electron reflector layer 104 is composed of a thin $Cd_{1-x}M_xTe$ layer, where x ranges from 0 to 1. In one non-limiting example, the pseudomorphically strained electron reflector layer 104 is composed of a thin $Cd_{1-x}Zn_xTe$ layer, where x is less than or equal to 0.51, and greater than or equal to 0.31, at the peak M concentration. In another non-limiting example, the pseudomorphically strained electron reflector layer 104 is composed of a thin $Cd_{1-x}Mg_xTe$ layer, where x is less than or equal to 0.28, and greater than or equal to 0.17, at the peak M concentration. In another non-limiting example, the pseudomorphically strained electron reflector layer 104 is composed of a thin $Cd_{1-x}Mn_xTe$ layer, where x is less than or equal to 0.24, and greater than or equal to 0.14, at the peak M concentration. Table 1, below, shows the different mole fractions for each of Mg, Mn, and Zn, that result in electron reflector barrier height qΦERF of 120 meV and 200 meV.

TABLE 1

M Mole Fractions
M mole fraction for ERF barriers

| M | ERF Φ = 120 meV | ERF Φ = 200 meV |
| --- | --- | --- |
| Mg | 0.17 | 0.28 |
| Mn | 0.14 | 0.24 |
| Zn | 0.31 | 0.51 |

Figure 3:
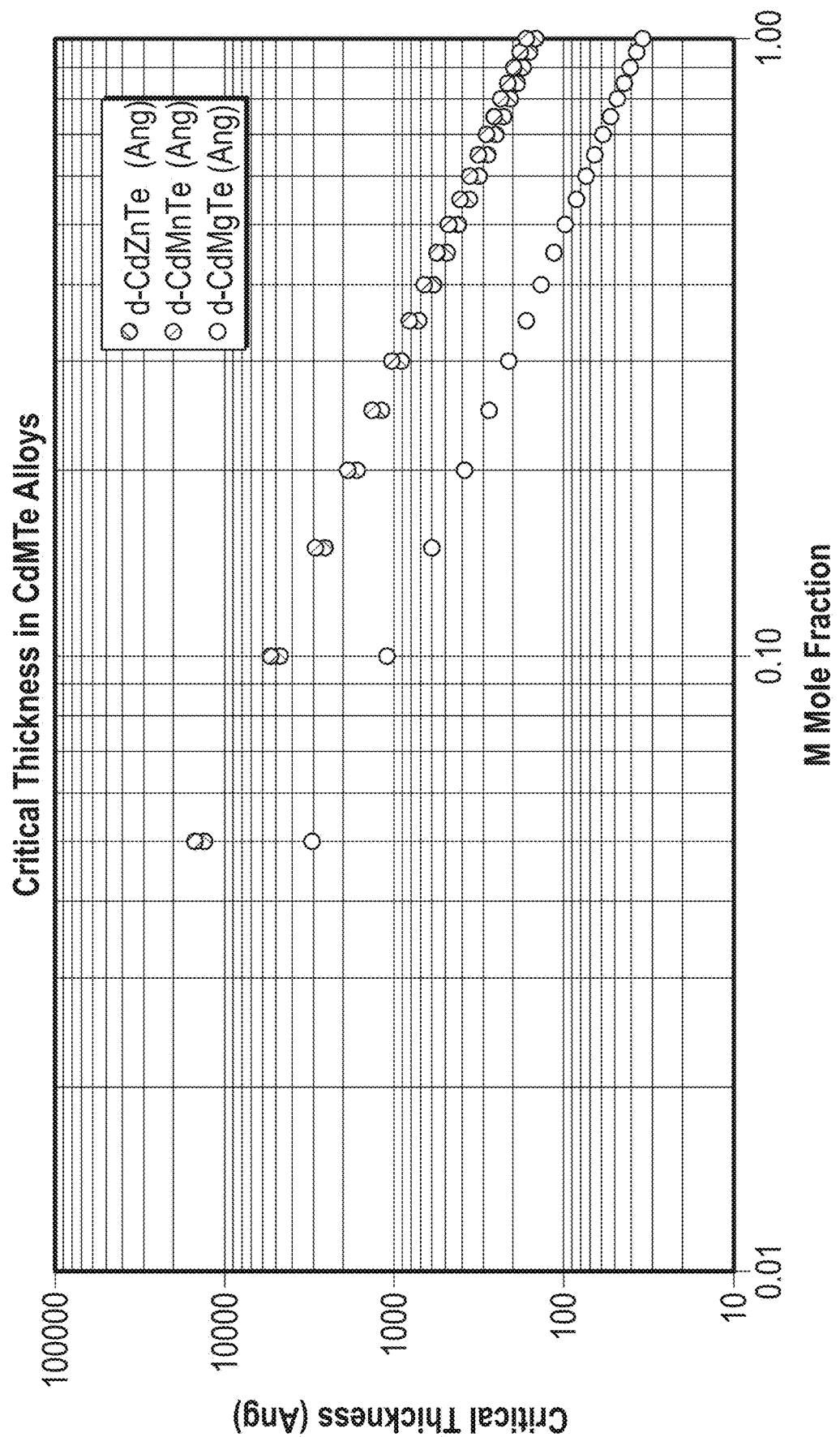
FIG. 3 graphically depicts critical thickness of CdZnTe, CdMnTe, and CdMgTe as a function of the mole fraction of M according to one or more embodiments shown and described herein.

Referring collectively to FIGS. 1-4, in certain embodiments, the thickness and maximum M concentration are selected such that the entire pseudomorphically strained electron reflector layer 104 is pseudomorphically strained. This means that no, or substantially no, misfit dislocations are generated at the substantially dislocation-free interfaces 112a, 112b between the bounding first p-type semiconductor layer 102 and second p-type semiconductor layer 106. However, as explained above, there is a limit to the thickness of the CdMTe film that can be used in order to accomplish this. Only thin layers of CdMTe can be grown on CdTe before the strain causes the formation of misfit dislocations at the interface, resulting in electron-hole recombination sites. Thus, a CdZnTe, CdMnTe, or CdMgTe electron reflector film should be thin enough (below the critical thickness) to avoid the formation of misfit dislocations. FIGS. 3 and 4 provide examples of calculated critical thicknesses of CdZnTe, CdMn, and CdMgTe layers. However, grading of the M component in the pseudomorphically strained electron reflector layer 104 such that the increase in M concentration is not abrupt near either of the substantially dislocation-free interface 112a and the substantially dislocation-free interface 112b reduces the strain and effectively increases the critical thickness before misfit dislocations are formed by strain relaxation. The substantially dislocation-free interface interface 112a between the first p-type semiconductor layer 102 and the pseudomorphically strained electron reflector layer 104 has no, or substantially no, defects (such as misfit dislocations). Unlike at other interfaces, this leads to a lower recombination rate between electrons and holes at the substantially dislocation-free interface interface 112a, which results in an improved device performance. For clarity, such a defect-free, or substantially defect-free, interface is referred to herein as a "pseudo-interface" or a "transition zone."

In some embodiments, the pseudomorphically strained electron reflector layer 104 is composed of a CdHgTe alloy. Notably, when CdHgTe is used in pseudomorphically strained electron reflector layer 104, the first p-type semiconductor layer 102 cannot be CdTe because the bandgap of CdHgTe is smaller than the bandgap of CdTe, meaning the CdHgTe layer does not serve as an adequate electron reflector when then first p-type semiconductor layer 102 is CdTe. Therefore, in embodiments wherein the pseudomorphically strained electron reflector layer 104 is composed of a CdHgTe alloy, the first p-type semiconductor layer 102 is composed of an absorber material having a bandgap lower than CdHgTe, such as, but not limited to, a different alloy of CdHgTe.

Figure 5:
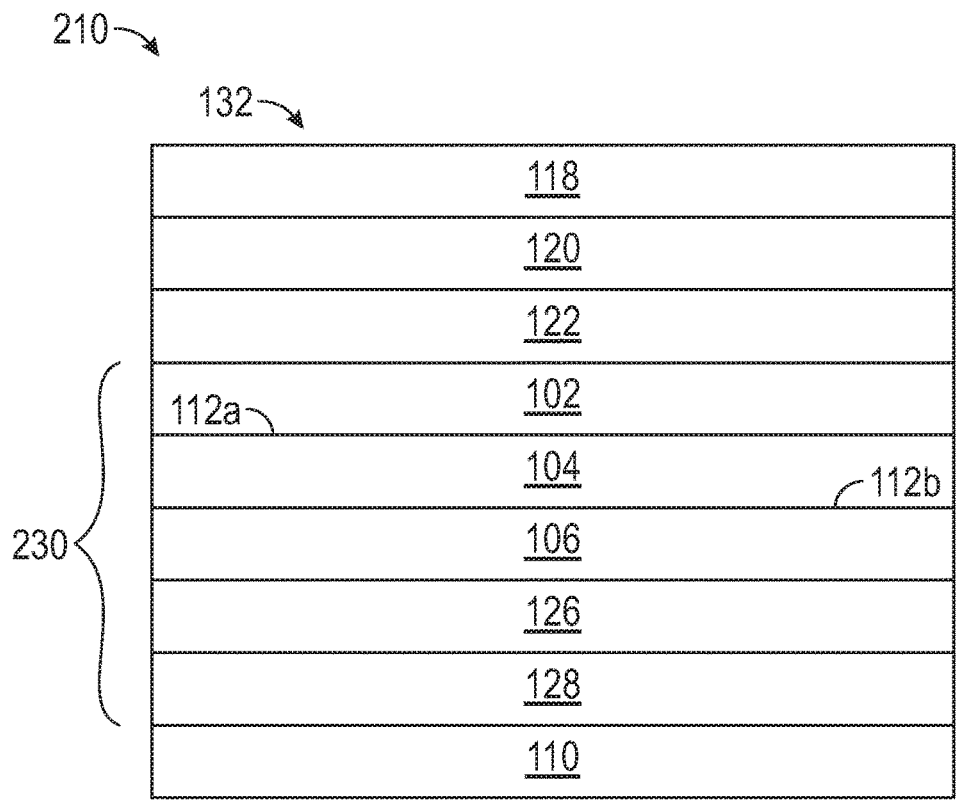
FIG. 5 schematically depict a thin film solar cell having multiple electron reflector layers according to one or more embodiments shown and described herein.

Referring now to FIG. 5, in another embodiment, the absorber structure 230 can be made of a series of thin, alternating electron reflector layers and p-type semiconductor layers. In one non-limiting example, a solar cell 210 can further include a second pseudomorphically strained electron reflector layer 126 adjacent to the second p-type semiconductor layer 106, and a third p-type semiconductor layer 128 on the second pseudomorphically strained electron reflector layer 126. In some embodiments, the second pseudomorphically strained electron reflector layer 126 and/ or the third p-type semiconductor layer 128 are doped with a dopant selected from the group consisting of nitrogen, phosphorus, arsenic, antimony, bismuth, copper, silver, and gold. In some embodiments, the third p-type semiconductor layer 128, like the first p-type semiconductor layer 102 and second p-type semiconductor layer 106, is a CdTe-based semiconductor material. In one non-limiting example, the third p-type semiconductor layer 128 includes a CdSeTe alloy. The thickness of each alternating layer can be in the range of 1-10 nm. Having alternating electron reflector layers and p-type layers allows for effectively synthesizing a graded ERF layer by alternate deposition of reflector material (e.g., CdMTe) and p-type material (e.g., CdTe) thin layers from discrete evaporation or sputtering sources. This can be accomplished by opening and closing shutters from each of the sources that are controlled to maintain a constant deposition rate. This embodiment eliminates the need to change powers to these sources to effect a change in the respective deposition rates, which is difficult to do over short deposition time periods. The sum of the total thicknesses of all the thin CdMTe layers should be below the critical thickness of a single CdMTe layer with the same fixed M composition. Thermal diffusion, or quartz lamp or laser annealing, or other annealing processes, could lead to intermixing of the thin CdMTe and CdTe layers resulting in a linear, parabolic, or other shaped conduction band profile in the pseudomorphically strained electron reflector layer 104.

Referring again to FIGS. 1 and 2, in certain embodiments, the maximum M (selected from Zn, Mg, or Mn) mole fraction in the pseudomorphically strained electron reflector layer 104 is selected such that the majority of the photo-generated electrons in the first p-type semiconductor layer 102 incident upon the pseudomorphically strained electron reflector layer 104 are reflected back to the main p-n junction. The electron reflector barrier height qΦERF of the conduction band 14 of the pseudomorphically strained electron reflector layer 104 is determined by the peak M mole fraction in the pseudomorphically strained electron reflector layer 104, as depicted in the energy diagram shown in FIG. 1. For instance, the density of thermal electrons decreases by a factor of 10 for an increase in electron energy of ~60 meV, as given by the Boltzmann distribution. Therefore, a minimum electron reflector barrier height qΦERF of 60 meV reflects back greater than 90% of the incident thermal electrons upon the pseudomorphically strained electron reflector layer 104. In certain embodiments, the electron reflector barrier height qΦERF of the conduction band 14 is between about 120 meV and about 200 meV. The electron reflector barrier height qΦERF of the pseudomorphically strained electron reflector layer 104 should be sufficiently high to suppress emission of the thermalized electron distribution in the absorber over the barrier. The number of thermal electrons decreases exponentially with energy. Without wishing to be bound by theory, it is believed that an electron reflector barrier height qΦERF of 200 meV reduces transmission of electrons over the barrier to a factor of 0.0006 times the electron distribution. An electron reflector barrier height qΦERF of 120 meV is believed to reduce transmission of electrons by a factor of 0.01. However, for certain electron reflector materials such as CdMnTe or CdMgTe, the barrier height should not be greater than about 200 meV, since beyond 200 meV there would not be a significant change in electron injection over the barrier, but there could be an increase in the valence band barrier which would undesirably block holes, increase series resistance, and decrease the fill factor. Therefore, in some embodiments, the pseudomorphically strained electron reflector layer 104 has a peak electron reflector barrier height qΦERF ranging from about 120 meV to about 200 meV. In other embodiments, the peak electron reflector barrier height qΦERF can be greater than 200 meV. It is noted that, in certain embodiments, the thickness of the electron reflector layer 104 is selected to prevent significant tunneling of electrons near the peak of the barrier in the conduction band 14.

The back structure 100 of the solar cell 200 can include any contact that provides an ohmic (low-resistance) transport of holes. In some embodiments, the back structure 100 of the solar cell 200 includes a back contact structure 116 composed of an interfacial layer 108 between the second p-type semiconductor layer 106 and a p+ ohmic back contact 110. The back contact structure 116 can be made using a graded CdMTe-p doped (such as $Cd_{1-x}Zn_xTe$, $Cd_{1-x}Mg_xTe$, or $Cd_{1-x}Mn_xTe$ p-doped) to form some or all of the interfacial layer 108. A back contact layer 110, which can be a very heavily doped ZnTe-p+ layer, can be deposited on the interfacial layer 108 to facilitate a low resistance contact, resulting in a high solar cell fill factor. Without wishing to be bound by theory, it is believed that the graded CdMTe-p doped interfacial layer reduces hole barriers in the valence band that would result in a higher series resistance and a reduced fill factor due to the back contact layers. The interfacial layer 108, when present, generally has a linear grading profile, though linear grading is not necessary. Linear or other grading of the interfacial layer 108 prevents the formation of a hole barrier that could increase series resistance and reduce fill factor for hole transport. The strain in such a composite back contact structure 116 can exceed the critical thickness, resulting in a high misfit dislocation density at the interface 114 between the interfacial layer 108 and the second p-type layer 106 (e.g., thin CdTe-p). However, since very few, if any, of the photo-generated electrons can reach the interface 114 (due to the electron reflection provided by the pseudomorphically strained electron reflector layer 104), there is no, or substantially no, additional electron-hole recombination in this region. Thus, the interfacial layer 108 can provide a means to separate the electron reflector region from the p-type back contact to further improve the efficiency of electron reflection.

The solar cell 200 employing the absorber structure 130 described above can have additional layers. The layers can include a support 118, a transparent conductive oxide (TCO) layer 120, a buffer layer 122, a window layer 124, and the back structure 100 described above, which includes a first p-type semiconductor layer (or absorber layer) 102, a pseudomorphically strained electron reflector layer 104, a second p-type semiconductor layer 106, an interfacial layer 108, and a back contact 110 (e.g., p+ ohmic layer). The pseudomorphically strained electron reflector layer 104 is sandwiched between the first p-type semiconductor layer 102 and the second p-type semiconductor layer 106 to form the absorber structure 130.

Figure 6:
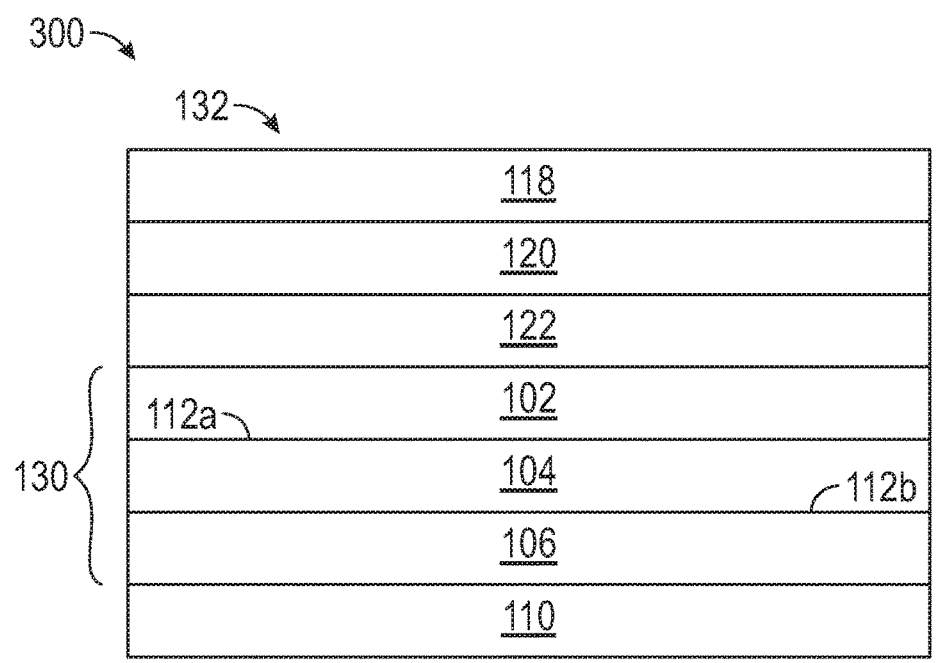
FIG. 6 schematically depicts a thin film solar cell without a window layer or interfacial layer according to one or more embodiments shown and described herein.

Alternatively, as illustrated in FIG. 6, a solar cell 300 employing the absorber structure 130 can include a support 118, a TCO layer 120, a buffer layer 122, a first p-type semiconductor layer 102, a pseudomorphically strained electron reflector layer 104, a second p-type semiconductor layer 106, and a back contact 110. In this embodiment, the pseudomorphically strained electron reflector layer 104 is still sandwiched between the first p-type semiconductor layer 102 and the second p-type semiconductor layer 106 to form the absorber structure 130, but the solar cell 300 does not include a window layer 124 or an interfacial layer 108, as depicted in the solar cell 200 of FIG. 1.

Referring collectively to FIGS. 1, 5, and 6, regardless of the configuration of thin film layers, the support 118 can be transferred from deposition station to deposition station via a rolling conveyor until all of the desired layers are deposited. Additional layers can be added using other techniques such as sputtering. Electrical conductors can be connected to the conductive layers (or "contacts") to collect the electrical energy produced when solar energy is incident on the absorber layer. The solar cell may further include an encapsulant or other protective layers to produce a weather resistant and environmentally robust cell or module.

Depending on the sequence in which the multilayer deposition is carried out, the thin films of the solar cells 200, 210, 300 may be deposited on a superstrate that ultimately serves as the incident layer in the final module, or the thin films of the solar cell may be deposited on a substrate that ends up serving as the backing layer in the final module. Therefore, the solar cells may have either of two types of construction. For simplification, the solar cells are described herein with reference to a "support," but it is understood that either type of construction can be used to fabricate the solar cells 200, 210, 300 of the present disclosure.

Referring again to FIG. 1, the solar cell 200 includes a support 118, a TCO layer 120, a buffer layer 122, an optional window layer 124 composed of an n-type semiconductor, an first p-type semiconductor layer 102 composed of a p-type semiconductor, a pseudomorphically strained electron reflector layer 104, which may include a graded ternary CdMTe phase or may include a uniform ternary CdMTe phase, a second p-type layer 106, an interfacial layer 108, and a back contact layer 110. The support 118 is typically glass, such as a low-iron float glass, a high transmission borosilicate glass, or other transparent glass material. The support 118 is generally thick enough to provide the necessary strength for the solar cells and modules as well as support for the subsequent film layers (e.g., from about 0.5 mm to about 10 mm), and is substantially flat to provide an adequate surface for forming the subsequent film layers. An optional anti-reflective coating layer may be formed on the support 118, on the sunny side 132 of the support 118. The anti-reflective coating layer, when present, reduces the reflection of the incident sunlight, so as to maximize the amount of sunlight captured in the cell. Suitable anti-reflective coatings include, but are not limited to, sol-gel based antireflective coatings.

Referring collectively to FIGS. 2, 5, and 6, the solar cell 200, 210, 300 can include the TCO layer 120, which is a transparent thin film that is also a conductor of electrical charge. The TCO layer 120 allows light to pass through to (optionally, a semiconductor window to) the active light absorbing material, and also serves as an ohmic electric contact (also referred to as the front contact) to transport photogenerated charge carriers away from the light absorbing material to an opaque metal conductor and the solar cell load. For instance, the TCO layer 120 can have a sheet resistance less than about 50 ohm per square, such as from about 4 ohm per square to about 40 ohm per square. The TCO layer 120 generally includes at least one conductive oxide, such as tin oxide, zinc oxide, indium tin oxide, zinc stannate, cadmium stannate, or mixtures thereof. Additionally, the TCO layer 120 can include dopants, such as fluorine, tin, aluminum, and the like, or other materials, as desired. In certain non-limiting examples, the TCO layer 120 includes fluorine-doped tin oxide, aluminum-doped zinc oxide, or indium tin oxide. In certain embodiments, the TCO layer 120 has a thickness of from about 0.05 micrometers to about 1 micrometer, or from about 0.1 micrometers to about 0.4 micrometers.

The TCO layer 120 can be formed by sputtering, chemical vapor deposition, spray pyrolysis, or any other suitable deposition method. In some embodiments, the TCO layer 120 is deposited by atmospheric pressure chemical vapor deposition (APCVD) or low pressure chemical vapor deposition (LPCVD).

In some embodiments, the solar cell 200 includes a window layer 124 which is an n-type semiconductor. When present, the role of the window layer 124 role is to form a photovoltaic heterojunction in combination with the first p-type semiconductor layer 102, e.g., a p-type absorber layer. When present, the window layer 124 is thin enough and has a wide enough bandgap (2.4 eV or more) to transmit most available light through to the first p-type semiconductor layer 102. A thin film CdS layer can be employed in the window layer 124 as the wide bandgap n-type heterojunction partner to CdTe. The use of a thinner film of CdS improves the conversion efficiency of the solar cells, as more of the photons with energy above the CdS bandgap of 2.42 eV are passed through the window layer 124. The window layer 124 may further include other materials, such as zinc sulfide, cadmium zinc sulfide, and mixtures thereof, as well as dopants and other impurities. In one non-limiting example, the window layer 124 includes oxygen up to about 25% by atomic percentage. Various methods may be used to deposit CdS thin films, such as, but not limited to, chemical bath deposition, vapor transport deposition, sol-gel, electrochemical deposition, thermal evaporation, sputtering, sublimation, and spraying. In certain embodiments, the window layer 124 has a thickness ranging from about 10 nanometers to about 200 nanometers, though often is in a range of from about 20 nanometers to about 100 nanometers.

In other embodiments, as depicted in FIGS. 5 and 6, the solar cells 210, 300 do not include a window layer. Instead, a layer of CdSe is deposited as a precursor which interdiffuses with a subsequently deposited CdTe layer to form a ternary CdSeTe p-type layer. Utilizing a CdSe precursor layer results in the formation of a graded alloy CdSeTe absorber that improves device short-circuit current ($J_{sc}$) and efficiency by capturing solar energy in the certain parts of solar spectrum that are otherwise lost in a typical CdS/CdTe structure. In such embodiments, CdSe is deposited and then diffuses to create a graded alloy CdSeTe absorber layer that absorbs longer wavelength photons than a CdS/CdTe window/absorber structure. Thus, the result is a single, graded ternary alloy that constitutes the first p-type semiconductor layer 102. In other embodiments, a graded- or uniform-composition CdSeTe alloy is deposited by any of the known thin film deposition techniques to form the first p-type semiconductor layer 102. It is understood that any p-type semiconductor layer described herein can be composed of a CdSeTe alloy.

Referring collectively to FIGS. 2, 5, and 6, the solar cells 200, 210, 300 may include an optional buffer layer 122, which can be a relatively high resistivity (compared to the TCO layer 120) n-type layer, on the side of the TCO layer 120 opposite to the support 118. The buffer layer 122 is more resistive than the TCO layer 120, and is sufficiently transparent to transmit most incident light to either the window layer 124 or, in embodiments without a window layer, the first p-type semiconductor layer 102. In certain non-limiting examples, the buffer layer 122 has a sheet resistance of greater than 1000 ohms per square. The buffer layer 122 may help protect the solar cell from chemical interactions between the TCO layer 120 and subsequent layers during manufacture of the cell. The buffer layer 122 may additionally help reduce electron-hole recombination at the interface between the TCO layer 120 and the the first p-type semiconductor layer 102 or the window layer 124. The buffer layer 122 may contain doped or undoped transparent oxides such as, but not limited to, $SnO_2$, $SiO_2$, $SnO_2$:Cd, $SnO_2$:Zn, or $CdZnO_2$. In certain embodiments, the buffer layer 122 has a composition with a stoichiometric ratio of $ZnO/SnO_2$ between about 0.25 and about 3, such as in about a 1:2 stoichiometric ratio of tin oxide to zinc oxide. The buffer layer 122 can be formed by sputtering, chemical vapor deposition, spray-pyrolysis, or any other suitable deposition method. In one non-limiting example, the buffer layer 122 is formed by sputtering (e.g., DC sputtering or RF sputtering) on the TCO layer 120. In certain embodiments, the buffer layer 122 has a thickness in the range of from about 10 nanometers to about 400 nanometers.

In other embodiments, the buffer layer 122 is a zinc magnesium oxide layer having the general formula of $Zn_yMg_{1-y}O$. Without wishing to be bound by theory, it is believed that a buffer layer 122 of ZnMgO is advantageous because of band alignments and/or the formation of a better interface with the window layer 124 or p-type semiconductor layer 102. Zn and Mg are isoelectronic with Cd, so these elements can mix at the interface between the buffer layer 122 and the window layer 124, or the interface between the buffer layer 122 and the p-type semiconductor layer 102, without changing the electrical properties of the CdTe or CdSeTe alloy.

Cadmium telluride (CdTe), or a ternary alloy (uniform or non-uniform) formed by deposition or from diffusion with CdTe, is generally employed in the p-type semiconductor layer 102 as an absorber. CdTe is a semiconductor with electrical properties recognized in the industry as well-suited for conversion of sunlight into electrical energy. The material has a bandgap that is nearly optimum for conversion of solar radiation, and the ability to be doped n-type or p-type, which permits the formation of a large range of junction structures. The CdTe can be doped with any number of suitable dopants including, but not limited to: nitrogen, phosphorus, arsenic, antimony, bismuth, copper, silver, and gold.

In the present disclosure, the first p-type semiconductor layer 102 is a p-type CdTe layer or a p-type CdSeTe alloy. The first p-type semiconductor layer 102 is the photovoltaic layer that interacts with the CdS window layer 124, when present, or the buffer layer 122 when no window layer 124 is present, to form a p-n junction. The first p-type semiconductor layer 102 absorbs the majority of the radiation energy passing into the cell due to its high absorption coefficient, thereby creating electron-hole pairs. The p-n junction formed between the first p-type semiconductor layer 102 and either the n-type window layer 124 or the buffer layer 122 is a diode in which the charge imbalance leads to the creation of an electric field spanning the p-n junction. The electric field separates the light-induced electron-hole pairs, thus producing electric current and energy from the absorbed radiation energy.

In certain embodiments, the first p-type semiconductor layer 102 has a thickness ranging from about 0.1 micrometers to about 10 micrometers, though often is from about 1.5 micrometers to about 4 micrometers. The first p-type semiconductor layer 102 can be formed using one or more deposition techniques known in the art. As non-limiting examples, such deposition techniques include magnetron sputtering, chemical bath deposition, chemical vapor deposition, or other deposition techniques based on evaporation or sublimation and condensation. Particularly useful deposition techniques include close-space sublimation (CSS), vapor transport deposition (VTD), ion-assisted physical vapor deposition (IAPVD), atmospheric pressure chemical vapor deposition (APCVD), radio frequency or pulsed magnetron sputtering (RFS or PMS), plasma enhanced chemical vapor deposition (PECVD), and electrochemical deposition (ECD).

The pseudomorphically strained electron reflector layer 104 is formed on the first p-type semiconductor layer 102. In certain embodiments, the pseudomorphically strained electron reflector layer 104 has a thickness ranging from about 10 nm to about 100 nm, which is limited by the critical thickness of the CdMTe layer deposited on the CdTe substrate. The pseudomorphically strained electron reflector layer 104 can be deposited through any of a variety of suitable deposition techniques. Non-limiting examples of such techniques include ion sputtering of electron reflector targets; thermal evaporation of CdTe, MnTe, MgTe, and/or Mg; metal organic chemical vapor deposition (MOCVD); liquid phase deposition (LPD); vapor transport deposition; and vacuum sputtering. In order to grade the concentration of M in the pseudomorphically strained electron reflector layer 104, techniques such as low energy ionization deposition are used, in which liquid materials are individually evaporated under reduced pressure, mixed in a chamber at a volume ratio changing over time, ionized by an electron impact, and accelerated in an electric field toward the substrate. As another example, chemical vapor deposition can produce a desired grading profile. For instance, to produce a triangular profile, chemical vapor deposition can be used by stepwise depositing CdMTe while increasing the M vapor concentration from zero to a desired amount. Once the peak M concentration is reached at the desired amount, CdMTe is then deposited stepwise while decreasing the M vapor concentration from the desired amount to zero at substantially the same rate of decrease as was used for the increase prior to reaching the peak M concentration. By varying the acceleration (for low energy ionization deposition) or flow rates (for chemical vapor deposition), a similar procedure can be utilized to obtain other grading profiles that are not triangular.

The pseudomorphically strained electron reflector layer 104 is sandwiched between the first p-type semiconductor layer 102 and the second p-type semiconductor layer 106. The second p-type semiconductor layer 106 is generally CdTe or a ternary alloy of CdSeTe. The second p-type semiconductor layer 106 may optionally be doped with any number of suitable dopants including, but not limited to: nitrogen, phosphorus, arsenic, antimony, bismuth, copper, silver, and gold. In certain embodiments, the second p-type semiconductor layer 106 is CdTe doped with As. The second p-type semiconductor layer 106 may be very thin. In certain embodiments, the second p-type semiconductor layer 106 has a thickness on the order of the thickness of the pseudomorphically strained electron reflector layer 104. In certain embodiments, the second p-type semiconductor layer 106 has a thickness ranging from about 10 nm to about 100 nm. The function of the second p-type semiconductor layer 106 is mainly to restore the original lattice constant of the first p-type semiconductor layer 102 (e.g., absorber layer). Thus, in certain embodiments, both the first p-type semiconductor layer 102 and the second p-type semiconductor layer 106 are composed of p-type CdTe. It is to be understood that the solar cells 200, 210, 300 will function without the second p-type semiconductor layer 106. However, because an interface between the pseudomorphically strained electron reflector layer 104 and materials such as ZnTe has defect states, solar cells 200, 210, 300 with the first p-type semiconductor layer 102 composed of p-type CdTe and the second p-type semiconductor layer 106 composed of CdTe to restore the original lattice constant have smaller recombination at the substantially dislocation-free interface 112a with the pseudomorphically strained electron reflector layer 104 than similar solar cells without a second p-type semiconductor layer 106. Without wishing to be bound by theory, it is believed that without the second p-type semiconductor layer 106 to restore the lattice constant of the CdTe absorber, there is generally more strain in the pseudomorphically strained electron reflector layer 104. The second p-type semiconductor layer 106 also acts to separate the pseudomorphically strained electron reflector layer 104 from the back contact layer 110 so as to prevent strain from forming and propagating dislocations into the pseudomorphically strained electron reflector layer 104 that would enhance undesirable electron-hole recombination. Furthermore, the second p-type semiconductor layer 106 can function to protect the pseudomorphically strained electron reflector layer 104 during CdCl$_2$ treatments. Chlorine has a tendency to pull Mg or Mn out of a CdMgTe or CdMnTe crystal. Therefore, without wishing to be bound by theory, it is believed that the presence of the second p-type semiconductor layer 106 helps protect the crystal integrity of the pseudomorphically strained electron reflector layer 104 during treatment with CdCl$_2$.

As described above, the pseudomorphically strained electron reflector layer 104 is pseudomorphically strained but with graded amounts of M so as to create the substantially dislocation-free interface 112a between the pseudomorphically strained electron reflector layer 104 and the first p-type semiconductor layer 102, and the substantially dislocation-free interface 112b between the pseudomorphically strained electron reflector layer 104 and the second p-type semiconductor layer 106. The pseudomorphically strained electron reflector layer 104 is a pseudomorphically strained CdMTe phase, where M is selected from Mg, Zn, or Mn. Without wishing to be bound by theory, it is believed that Mg, Zn, and Mn are especially suitable for use in the pseudomorphically strained electron reflector layer 104 because the CdMgTe, CdZnTe, and CdMnTe alloys have the same crystal structure as CdTe. Thus, the crystallography matches across the substantially dislocation-free interfaces 112a, 112b between the semiconductor layers 102, 106 and the CdMTe alloy in the pseudomorphically strained electron reflector layer 104.

Referring again to FIG. 2, the back contact structure 116 can include an interfacial layer 108 and a back contact layer 110 (e.g., a p+-type ohmic layer). The back contact layer 110 generally serves as the back electrical contact, in relation to the opposite, TCO layer 120 serving as the front electrical contact. The back contact layer 110 is generally made from one or more highly conductive materials, such as, but not limited to, elemental nickel, molybdenum, palladium, chromium, copper, tin, silver, gold, or alloys or mixtures thereof. The back contact layer 110 may also include a graphite blend or carbon paste that can be heated and converted into a conductive back contact. In certain embodiments, the back contact layer 110 is a heavily doped ZnTe-p+ layer. ZnTe is a relatively wide bandgap semiconductor whose valence band maximum closely matches that of CdTe.

The interfacial layer 108, when present, can be employed between the second p-type semiconductor layer 106 and the back contact layer 110. The interfacial layer 108 includes a graded p+-type CdMTe layer, where M is Zn, Mg, or Mn. In some embodiments, the interfacial layer 108 is linearly graded, such that the concentration of M increases but does not decrease across the thickness of the interfacial layer 108. In this manner, an additional electron reflector is used to form an interfacial layer near the p+ ohmic back contact. For example, CdZnTe (CZT) can be used to form the interfacial layer. In certain embodiments, the interfacial layer 108 is a graded $Cd_{1-x}Zn_x$Te-p doped (CZT) layer. In other embodiments, the interfacial layer 108 is composed of a $Cd_{1-x}Mg_x$Te-p doped layer. In other embodiments, the interfacial layer 108 is composed of a $Cd_{1-x}Mn_x$Te-p doped layer. Linear grading of the interfacial layer 108 reduces the strain and effectively increases the critical thickness before misfit dislocations are formed by strain relaxation. The interfacial layer 108, when present, may also serve the purpose of dopant management. For instance, the interfacial layer 108 may prevent the diffusion of Cu.

Referring collectively to FIGS. 2, 5, and 6, the solar cells 200, 210, 300 may optionally further include one or more additional buffer layers used to reduce the lattice mismatch between two material systems. The material of the additional buffer layer(s) can be organic, inorganic, metal, semiconductor, and so on, and the function of the additional buffer layer(s) can be as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on.

The solar cells 200, 210, 300 may further include various other components or features not highlighted in this description. Such other components or features may include, but are not limited to, bus bars, external wiring, laser scribes, and the like. For example, edge sealing layers can be applied around the edges of a photovoltaic module (which is composed of multiple solar cells) to seal the substrate to the encapsulant along each edge. When the solar cells 200, 210, 300 are connected in series and/or in parallel to form a photovoltaic module, a plurality of solar cells can be connected in series in order to achieve a desired voltage, such as through an electrical wiring connection. Each end of the series connected cells can be attached to a suitable conductor such as a wire or bus bar, to direct the photovoltaically generated current for connection to a device or other system using the generated electricity. Laser scribing can be a convenient means for achieving such series connections. Additionally, bus bars can be attached to connect a photovoltaic module to electrical leads. When photovoltaic modules are connected to each other in series, bus bars can serve as opposite electrical connections (e.g., positive and negative).

The pseudomorphically strained electron reflectors described herein are high band gap alloys that can passivate the CdTe or CdSeTe surface of a solar cell as described herein, providing numerous advantages. The recombination rate at a bare CdTe surface is very high because of a high concentration of dangling bonds on the surface, which are efficient recombination centers. However, the growth of a stack including a CdTe/CdMTe structure, where M is Zn, Mg, or Mn, can result in a CdTe surface having a substantially reduced recombination at CdTe/CdMTe interface compared to CdTe free surface. This structure results in an improved absorber layer. Without wishing to be bound by theory, it is believed that this improvement is due to the very low interface state density at the CdTe/CdMTe heterointerface, and good electron confinement in the CdTe layer.

Examples

A CdMTe/CdTe/CdMTe structure was implemented in structures employed for demonstration of the positive effect of the electron reflector by means of photoluminescence intensity (PLI). PLI was analyzed as a quality measure of the absorber material. PLI is a measure of how many carriers live long enough to radiatively recombine under an applied laser illumination. Only charge carriers which live long enough (i.e., which do not recombine at defects in the material) can radiatively recombine. PLI is thus an indirect measure of non-radiative processes going on in the material. In turn, the non-radiative recombination processes are one of the primary factors limiting solar cell performance. An increased PLI therefore demonstrates that non-radiative processes in the absorber material have been suppressed, and a solar cell with such an absorber generally has higher performance. It should be noted that the PLI experiments described herein were performed in single crystal systems as model systems. In polycrystalline materials, the carrier lifetimes would be shorter, but the structures would nonetheless perform in the same manner.

CdMTe/CdTe/CdMTe stacks were grown, and yielded significant improvements in PLI compared to a bare CdTe surface. Films were grown on single crystal CdTe substrates using molecular beam epitaxy (MBE). For example, a CZT-CdTe double barrier heterostructure was produced, having a CdTe layer sandwiched between two $Cd_{0.8}Zn_{0.2}Te$ layers, on a CdTe substrate. A typical PLI test structure uses a double-heterostructure for carrier confinement and varying CdTe absorber thicknesses to extract effective carrier lifetime and surface recombination velocity. Therefore, the $Cd_{0.8}Zn_{0.2}Te$ layers were 25 nm, and the thickness of the CdTe layer was varied from 1 μm, 2 μm, 5 μm, and 10 μm. A CdTe epitaxial buffer layer was deposited between one of the $Cd_{0.8}Zn_{0.2}Te$ layers and the substrate. Thus, the structure was CdTe substrate/CdTe epitaxial buffer layer/CZT layer (25 nm)/CdTe (1 μm, 2 μm, 5 μm, or 10 μm)/CZT layer (25 nm).

Figure 7:
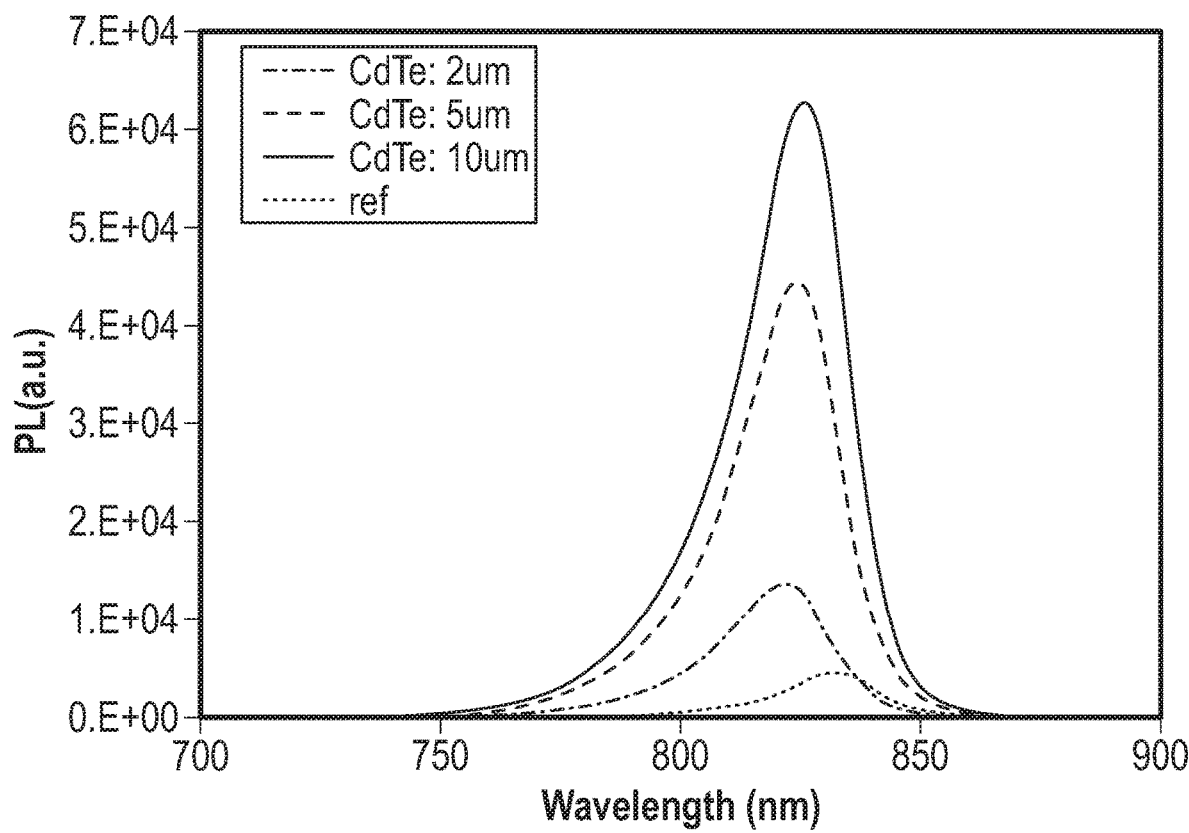
FIG. 7 schematically depicts photoluminescence intensity (PLI) as a function of wavelength in a CdZnTe—CdTe double barrier heterostructure according to one or more embodiments shown and described herein.
Figure 8:
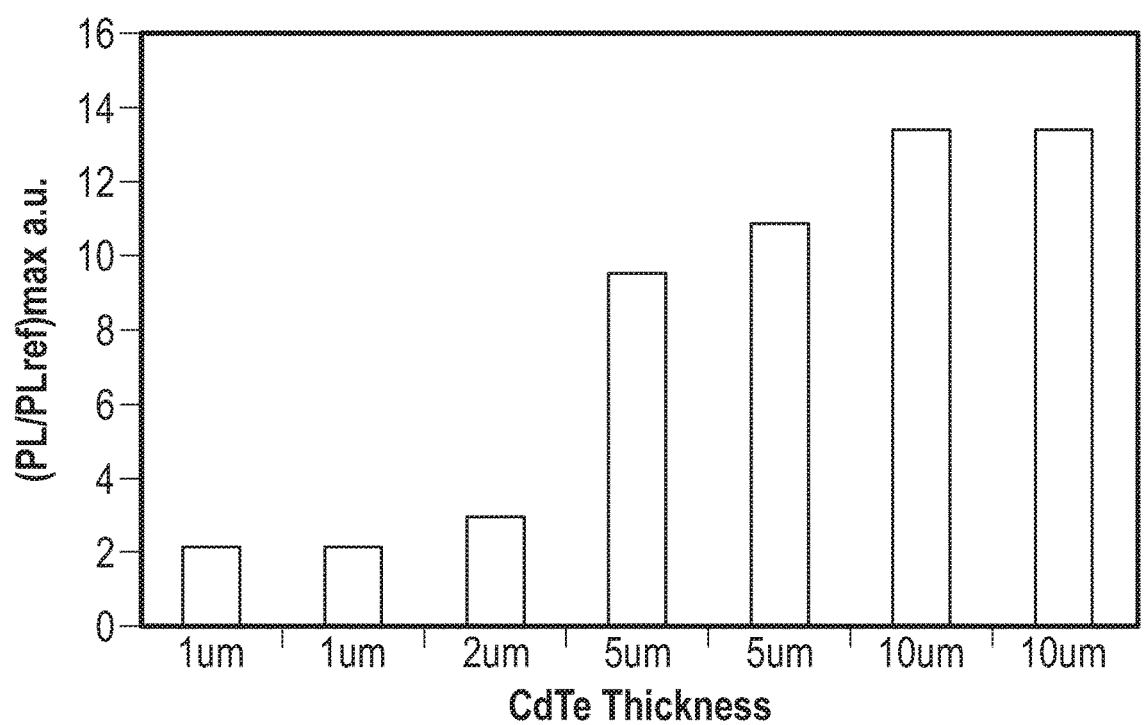
FIG. 8 graphically depicts PLI as a function of CdTe thickness in a CdZnTe—CdTe double barrier heterostructure according to one or more embodiments shown and described herein.

Referring collectively to FIGS. 7 and 8, the growth of the CdZnTe/CdTe/CdZnTe stack on a CdTe substrate yielded a PLI 10× that of a bare CdTe surface. The growth of a similar CdMgTe/CdTe/CdMgTe stack on a CdTe substrate yielded a PLI 5000× that of a bare CdTe surface. This indicates that there is a very low interface defect density and recombination rate at the CdTe/CdMTe interfaces, and good electron confinement and lifetime in the sandwiched CdTe layer. As seen from the graph in FIG. 8, the PLI increased with increasing thickness of the sandwiched CdTe layer.

CdZnTe, CdMnTe, and CdMgTe heterojunctions formed with CdTe in single crystal films grown by molecular beam epitaxy (MBE) substantially reduced the interface recombination velocity, as shown by PLI and time-resolved photoluminescence (TRPL) measurements. FIG. 7 shows a graph of the PLI as a function of wavelength. FIG. 8 shows a graph of the PLI as a function of the CdTe thickness. As seen from FIGS. 7-8, PLI in the infrared region generally increased with increasing CdTe thickness.

In structures having smaller CdTe interface recombination, the PLI thickness dependence is generally more linear. In contrast, in structures having larger interface recombination, the PLI thickness dependence is generally more quadratic. The data shown in FIGS. 7-8 tends to show a more linear correlation between PLI and thickness. Therefore, this data indicates that interface recombination is small in the structures tested.

Figures 9, 10:
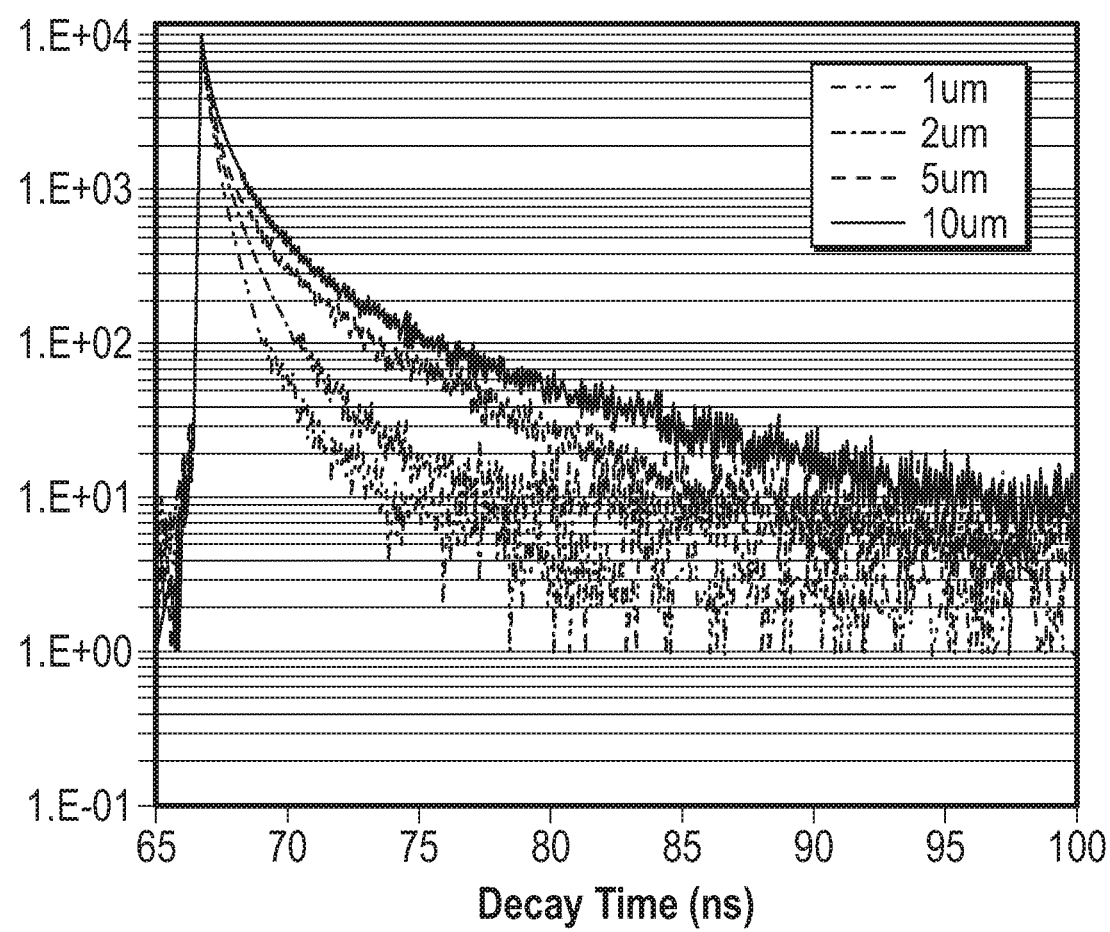
FIG. 9 graphically depicts photoluminescence from varying CdTe thicknesses as a function of time (time-resolved photoluminescence, TRPL) according to one or more embodiments shown and described herein.
FIG. 10 provides TRPL lifetime as a function of CdTe thickness in tabular form according to one or more embodiments shown and described herein.
Figure 11:
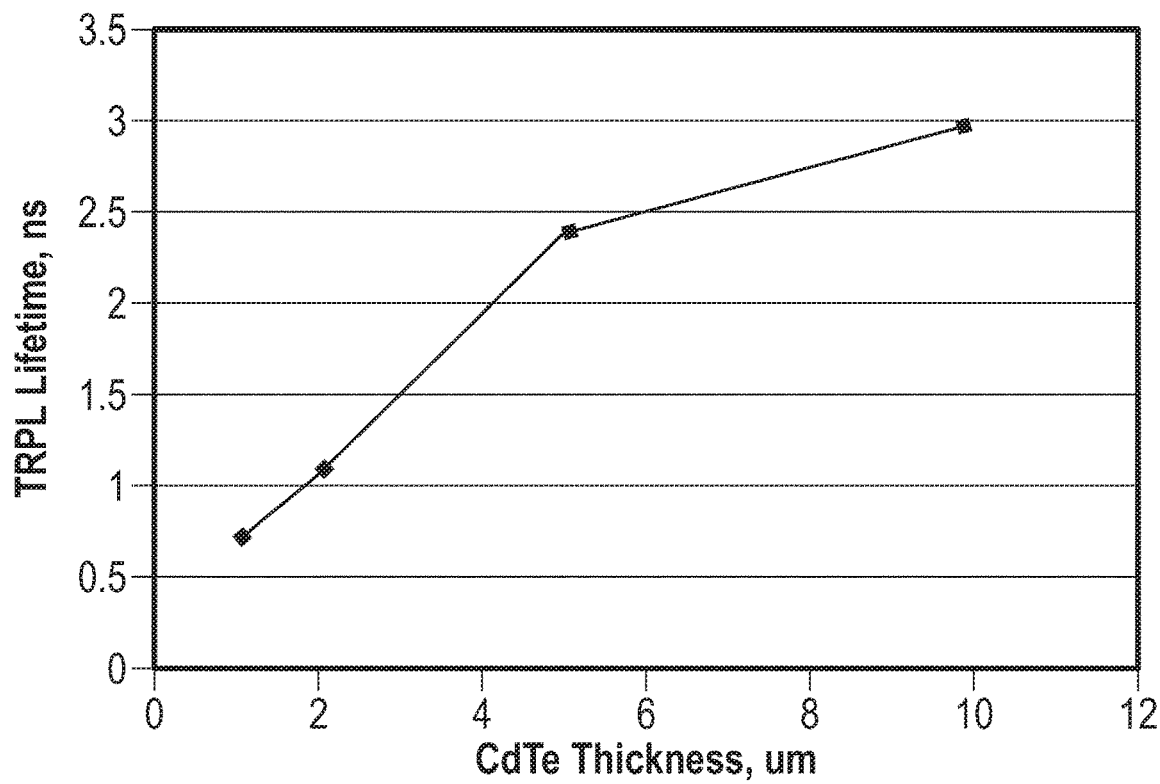
FIG. 11 graphically depicts the TRPL lifetime versus CdTe thickness of FIG. 10 according to one or more embodiments shown and described herein.

FIGS. 9-11 give the results of the TRPL measurements, showing the decay time in a CZT-CdTe double barrier heterostructure as a function of the CdTe thickness. To obtain TRPL measurements, the samples were excited with a light pulse and then the decay in photoluminescence was measured with respect to time. TRPL is a useful technique for measuring the minority carrier lifetime in semiconductors. As seen from FIGS. 9-10, the decay time generally increased with increasing CdTe thickness. This indicates that electrons are living (i.e., not recombining with holes) for longer in the CdTe double heterostructure than in a bare CdTe layer. Thus, using the CdZnTe, CdMnTe, and CdMgTe heterointerfaces with CdTe reduces recombination at CdTe interfaces and increases effective carrier lifetime. Similarly to PLI, more linear thickness dependence of the effective lifetime indicates low interface recombination whereas a more quadratic dependence indicates high interface recombination. The data shown in FIG. 11 tends to show a more linear correlation between lifetime and thickness, indicating low interface recombination.

Referring again to FIGS. 3 and 4, CdZnTe-p+ layers with linearly graded Zn concentrations were inserted into small area solar cells. The results show that linear grading of an electron reflector layer can be used to tailor the critical thickness before formation of misfit dislocations that can form electron recombination centers. As seen in FIG. 3, the critical thickness of the CZT layer decreased linearly with increasing concentration of Zn. As shown in FIG. 4, the critical thickness of a CdZnTe layer is about 38.5 nm where the mole fraction of Zn is 0.2, about 9.76 nm where the mole fraction of Zn is 0.5, and about 5.31 nm where the mole fraction of Zn is 0.75.

Figure 12:
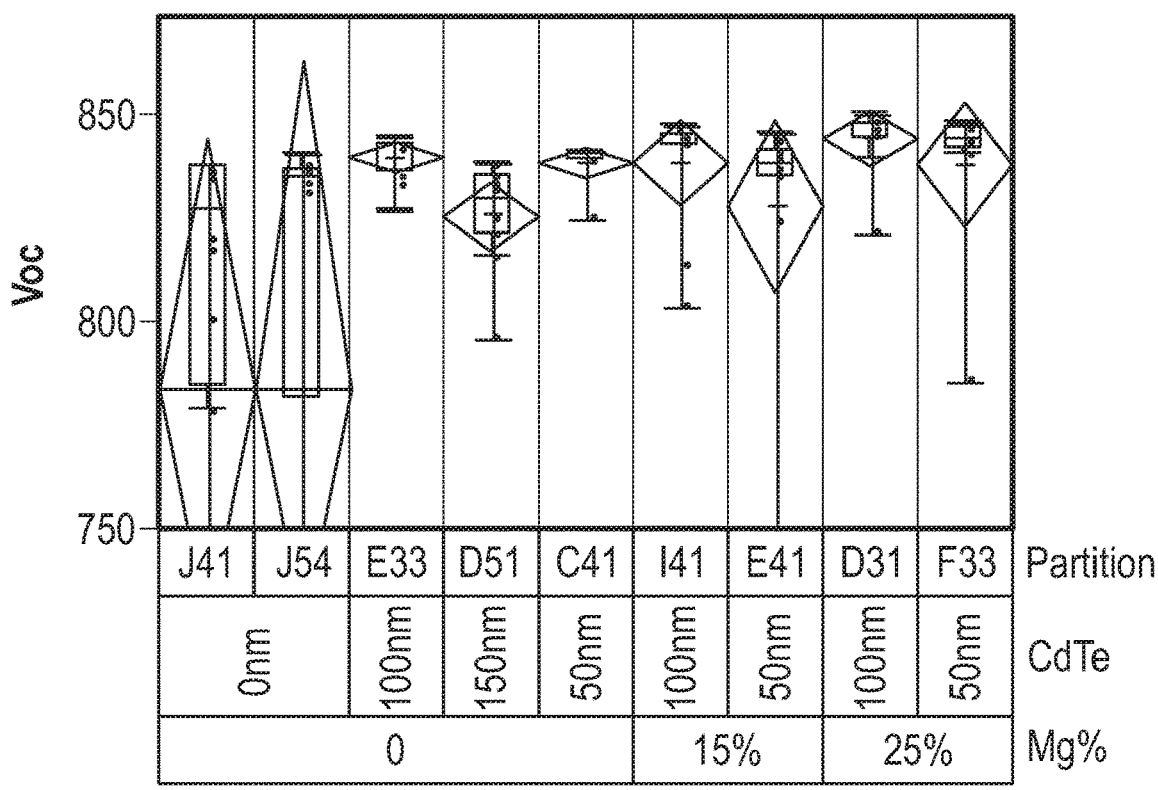
FIG. 12 graphically depicts $V_{oc}$ enhancement with the addition of a CdMgTe electron reflector layer according to one or more embodiments shown and described herein.
Figure 13:
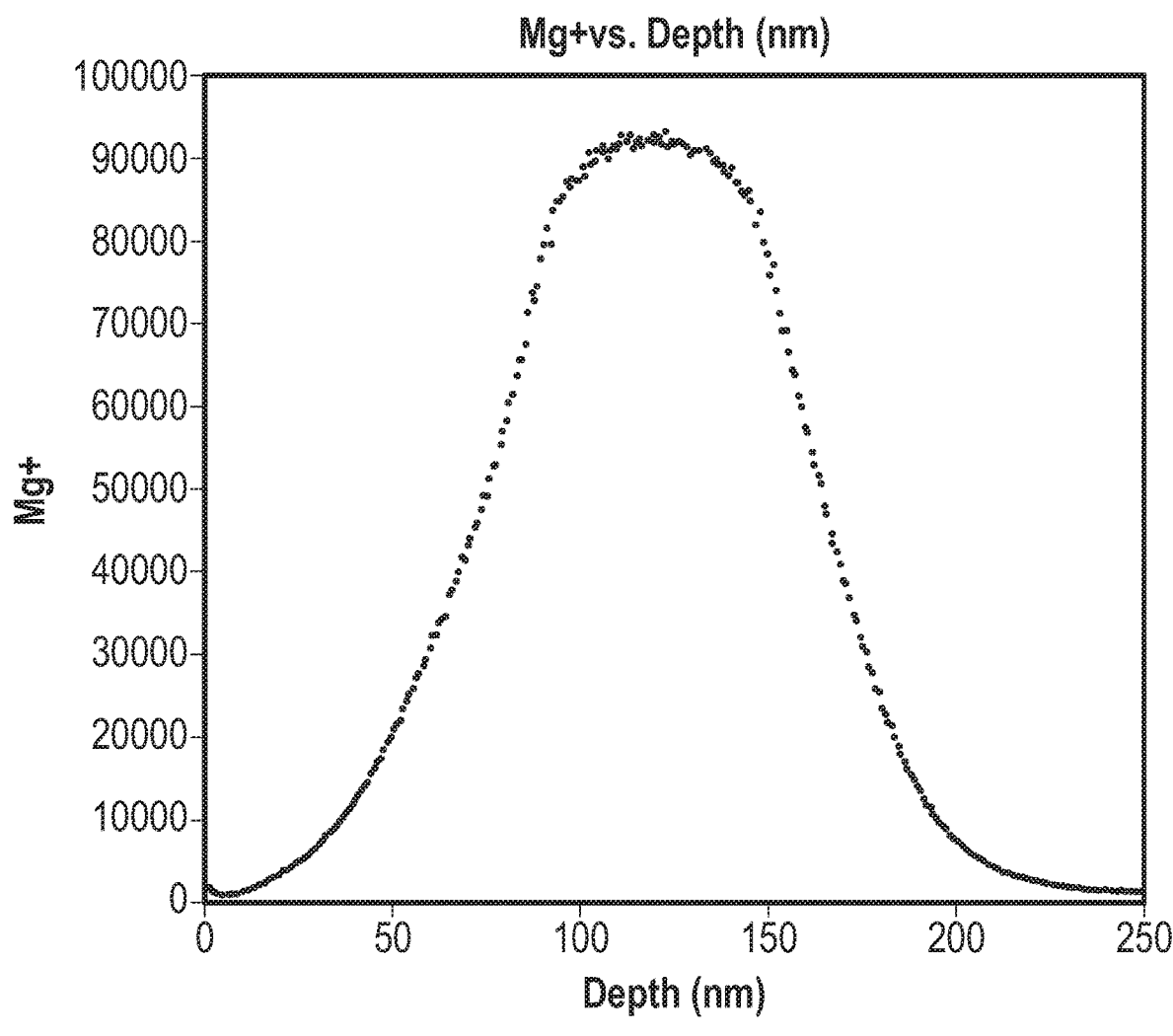
FIG. 13 graphically depicts a graded concentration of Mg across a CdMgTe electron reflector layer according to one or more embodiments shown and described herein.

FIGS. 12-15 show various characteristics of, and improvements achieved with solar cells including CdTe cap layers of varying thickness, ranging from 0 to 100 nm. Solar cells having pseudomorphic 50 nm-thick CdMgTe pseudomorphically strained electron reflector layers were produced. The mole fraction of Mg was varied. The solar cells included CdTe cap layers of varying thickness, ranging from 0 to 100 nm. FIG. 12 shows $V_{oc}$ data from the solar cells. As seen from FIG. 12, $V_{oc}$ was slightly improved with a CdMgTe pseudomorphically strained electron reflector layer. The best $V_{oc}$ was obtained with a Mg mole fraction of 25%. FIG. 13 depicts the concentration of Mg as a function of thickness across CdMgTe electron reflector layer in a solar cell. FIG. 13 shows a graded profile of Mg in the pseudomorphically strained electron reflector layer adjacent to the CdTe layers. As seen from the graph in FIG. 13, the concentration of Mg was substantially less near the edges of the pseudomorphically strained electron reflector layer than it was near the center of the pseudomorphically strained electron reflector layer. FIG. 13 shows that in these examples, the grading profile of Mg was bell-shaped.

Figure 14:
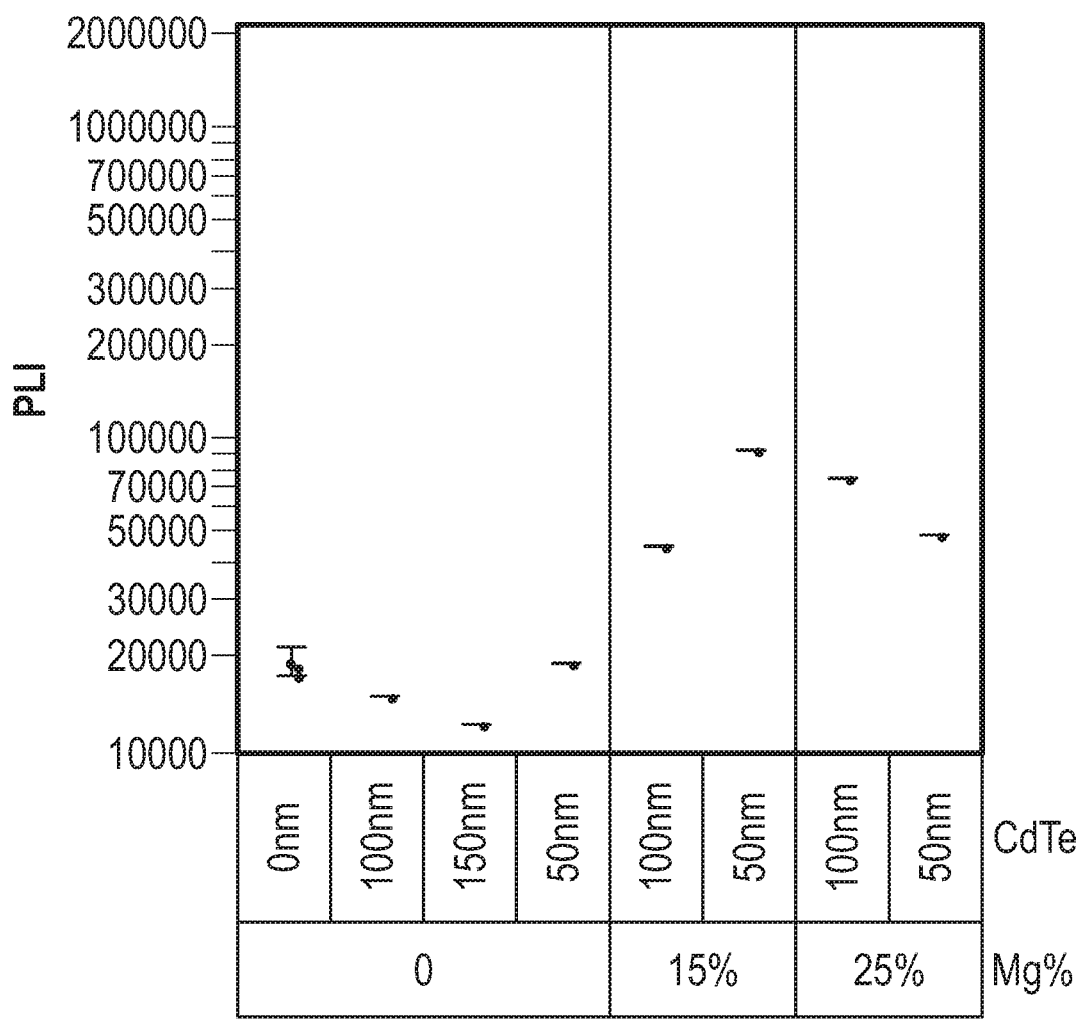
FIG. 14 graphically depicts a photoluminescence enhancement with a CdMgTe ERF layer according to one or more embodiments shown and described herein.
Figure 15:
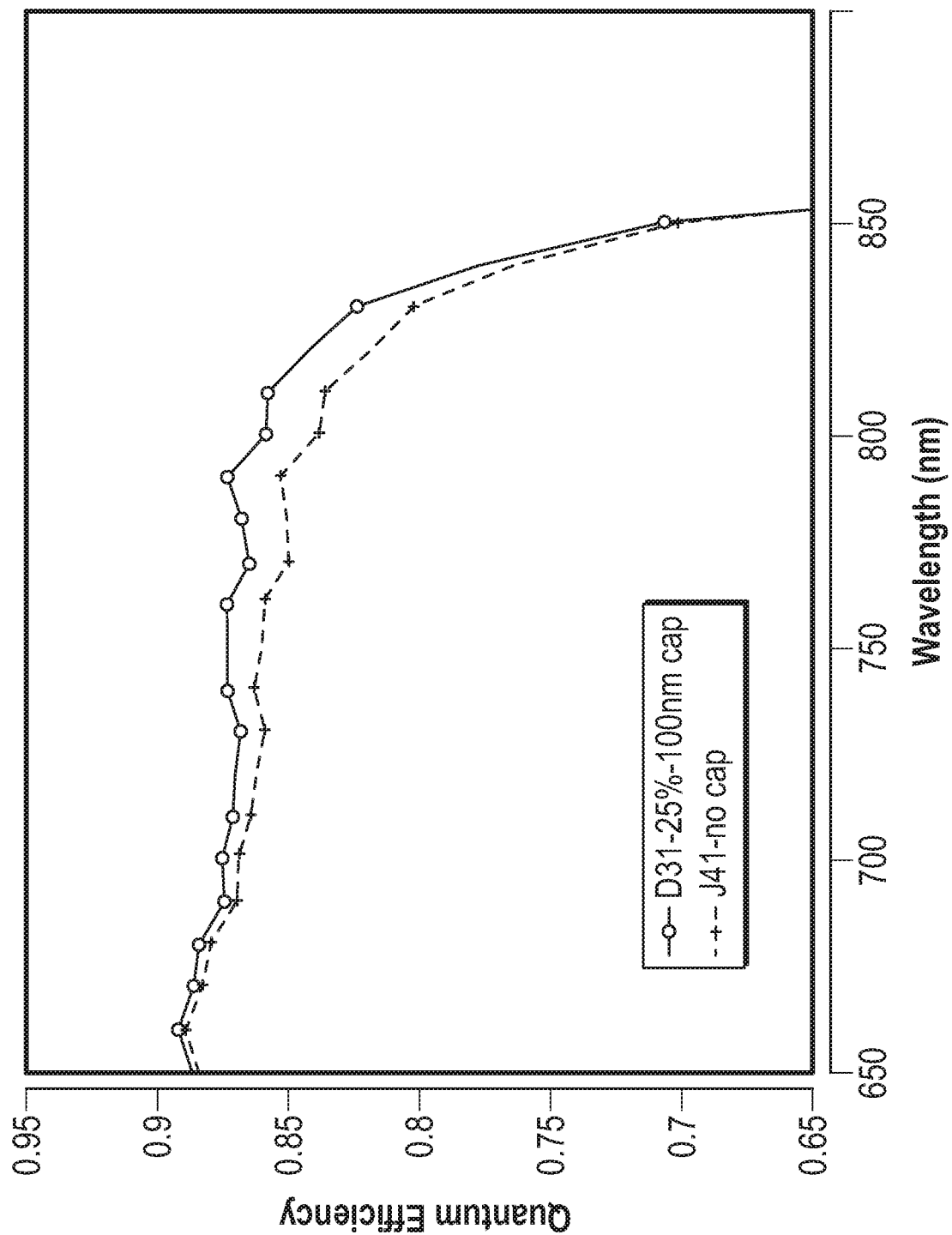
FIG. 15 graphically depicts a quantum efficiency (QE) enhancement at long wavelengths with a CdMgTe ERF layer according to one or more embodiments shown and described herein.

FIG. 14 is a graph showing PLI as a function of mole fraction of Mg in a CdMgTe pseudomorphically strained electron reflector layer. As seen from FIG. 14, the PLI increased 5× with the addition of a CdMgTe pseudomorphically strained electron reflector layer having either 15% or 25% mole fraction of Mg. FIG. 15 shows that Quantuim Efficiency was enhanced at long wavelengths when a CdMgTe pseudomorphically strained electron reflector layer was present.

Certain embodiments of the solar cells, absorber structures, back contact structures, and methods disclosed herein are defined in the above examples. It should be understood that these examples, while indicating particular embodiments of the disclosure, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A solar cell comprising:
   a first p-type semiconductor layer on an n-type layer;
   an electron reflector layer on the first p-type semiconductor layer forming a first interface therebetween, the electron reflector layer having a thickness and comprising a CdMTe layer, wherein M is selected from the group consisting of Mg, Mn, and Zn; and
   a second p-type semiconductor layer on the electron reflector layer forming a second interface therebetween, wherein the second interface is an interface of the second p-type semiconductor layer and the electron reflector layer;
   wherein the electron reflector layer has a graded concentration of M such that a concentration of M increases from substantially zero at the first interface to a peak concentration at a position in the electron reflector layer between the first interface and the second interface, and decreases from the peak concentration to substantially zero at the second interface.

2. The solar cell of claim 1, wherein the concentration of M in the CdMTe layer is sufficient at the peak concentration of M in the electron reflector layer to create a conduction band barrier height of at least about 120 meV at the position corresponding to the peak concentration of M, wherein the conduction band barrier height is an amount of energy relative to a conduction band energy of the first p-type semiconductor layer.

3. The solar cell of claim 2, wherein the conduction band barrier height is between about 120 meV and about 200 meV at the position corresponding to the peak concentration of M.

4. The solar cell of claim 1, wherein the position corresponding to the peak concentration of M in the electron reflector layer intermediate between the first interface and the second interface is approximately equidistant between the first interface and the second interface.

5. The solar cell of claim 1, wherein the graded concentration has a triangular profile.

6. The solar cell of claim 2, wherein M is Mg present at a mole fraction of at least about 17% at the position corresponding to the peak concentration of M.

7. The solar cell of claim 2, wherein M is Mn present at a mole fraction of at least about 14% at the position corresponding to the peak concentration of M.

8. The solar cell of claim 2, wherein M is Zn present at a mole fraction of at least about 31% at the position corresponding to the peak concentration of M.

9. The solar cell of claim 1, wherein the CdMTe layer is doped with a dopant selected from the group consisting of nitrogen, phosphorus, arsenic, antimony, bismuth, copper, silver, and gold.

10. The solar cell of claim 1, wherein the first p-type semiconductor layer is doped with a dopant selected from the group consisting of nitrogen, phosphorus, arsenic, antimony, bismuth, copper, silver, and gold.

11. The solar cell of claim 1, wherein the second p-type semiconductor layer is doped with a dopant selected from the group consisting of nitrogen, phosphorus, arsenic, antimony, bismuth, copper, silver, and gold.

12. The solar cell of claim 1, wherein the electron reflector layer is doped with a dopant selected from the group consisting of nitrogen, phosphorus, arsenic, antimony, bismuth, copper, silver, and gold.

13. The solar cell of claim 1, wherein the electron reflector layer has a thickness ranging from about 10 nm to about 100 nm.

14. The solar cell of claim 1, further comprising a second electron reflector layer on the second p-type semiconductor layer, and a third p-type semiconductor layer on the second electron reflector layer.

15. The solar cell of claim 14, wherein the second electron reflector layer is doped with a dopant selected from the group consisting of nitrogen, phosphorus, arsenic, antimony, bismuth, copper, silver, and gold.

16. The solar cell of claim 1, wherein:
   the first p-type semiconductor layer comprises cadmium and tellurium;
   the second p-type semiconductor layer comprises cadmium and tellurium; and
   the electron reflector layer has a thickness ranging from about 10 nm to about 100 nm.

17. The solar cell of claim 1, wherein the thickness of the electron reflector layer is below a critical thickness defined by an intrinsic lattice parameter of the first p-type semiconductor layer.

18. A solar cell comprising:
   a first p-type semiconductor layer on an n-type layer, wherein the first p-type semiconductor layer comprises CdTe;
   an electron reflector layer on the first p-type semiconductor layer forming a first interface therebetween, the electron reflector layer having a thickness in a range from about 10 nm to about 100 nm;
   a second p-type semiconductor layer on the electron reflector layer forming a second interface therebetween, wherein the second interface is an interface of the second p-type semiconductor layer and the electron reflector layer, and wherein the second p-type semiconductor layer comprises an alloy including cadmium and tellurium; and a back contact on the second p-type semiconductor layer, wherein the back contact comprises a ZnTe p+ layer; wherein:
the electron reflector layer comprises CdZnTe, where Zn is present at a mole fraction ranging from about 0.31 to about 0.51 at a peak concentration,
the peak concentration corresponds to a position within the electron reflector layer between the first interface and the second interface, and
a conduction band barrier height is in a range from about 120 meV to about 200 meV at the peak position in the electron reflector layer relative to a conduction band energy of the first p-type semiconductor layer.

19. A solar cell comprising:
a first p-type semiconductor layer on an n-type layer, the first p-type semiconductor layer comprising cadmium and tellurium;
a second p-type semiconductor layer, the second p-type semiconductor layer comprising cadmium and tellurium; and
an electron reflector layer between the first p-type semiconductor layer and the second p-type semiconductor layer, the electron reflector layer comprising a CdMTe layer, where M is selected from the group consisting of Zn, Mg, and Mn;
wherein the electron reflector layer comprises a graded concentration of M such that the electron reflector layer forms a first pseudo-interface with the first p-type semiconductor layer and a second pseudo-interface with the second p-type semiconductor layer;
wherein a concentration of M in the CdMTe layer is sufficient at a position in the electron reflector layer to create a conduction band barrier height of at least about 120 meV; and
wherein the graded concentration of M is not abrupt at either the first pseudo-interface or the second pseudo-interface.

20. The solar cell of claim 19, wherein M is Zn, and the CdMTe layer comprises $Cd_{1-x}Zn_xTe$, where x has a maximum value in a range from about 0.31 to about 0.51 in the electron reflector layer.

* * * * *